(12) United States Patent
Urushihara et al.

(10) Patent No.: US 8,060,034 B2
(45) Date of Patent: *Nov. 15, 2011

(54) POLAR MODULATION TRANSMISSION APPARATUS

(75) Inventors: Tomoya Urushihara, Chiba (JP); Akihiko Matsuoka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 618 days.

This patent is subject to a terminal disclaimer.

(21) Appl. No.: 12/185,763

(22) Filed: Aug. 4, 2008

(65) Prior Publication Data

US 2010/0029225 A1 Feb. 4, 2010

(51) Int. Cl.
*H04B 1/04* (2006.01)
*H04B 17/00* (2006.01)

(52) U.S. Cl. ............... 455/114.3; 455/115.1; 455/127.2

(58) Field of Classification Search ............... 455/114.3, 455/115.2, 115.1, 127.2, 127.3; 375/295–298
See application file for complete search history.

(56) References Cited

U.S. PATENT DOCUMENTS

| | | | | |
|---|---|---|---|---|
| 7,024,608 B2* | 4/2006 | Kurokami | ..................... | 714/746 |
| 7,126,999 B2* | 10/2006 | Dent | ............................. | 375/261 |
| 7,348,844 B2* | 3/2008 | Jaenecke | ...................... | 330/149 |
| 7,496,334 B2* | 2/2009 | Saito | .......................... | 455/114.3 |
| 7,551,687 B2* | 6/2009 | Ode et al. | ...................... | 375/296 |
| 7,792,200 B2* | 9/2010 | Molander | ..................... | 375/260 |
| 2002/0154708 A1 | 10/2002 | Rouphael | | |
| 2010/0029224 A1* | 2/2010 | Urushihara et al. | .......... | 455/102 |

* cited by examiner

*Primary Examiner* — Sonny Trinh
(74) *Attorney, Agent, or Firm* — Dickinson Wright PLLC

(57) ABSTRACT

By compensating for a detection result of the detector in feedback control of output power of the power amplifier, the polar modulation transmission apparatus is able to realize accurate transmission power control. Polar modulation transmission apparatus 100 has detector 106 that detects output power of power amplifier 103, PAPR calculating section 131 that calculates the PAPR of the spread modulated signal, compensation value generating section 134 that outputs a compensation value corresponding to the calculated PAPR and an arithmetic operator that performs an arithmetic operation using the compensation value and a detection result obtained by detector 106. By this means, it is possible to compensate for the sensitivity of detector 106 (measurement sensitivity) that changes depending on the βparameter and mode and make the sensitivity of detector 106 (measurement sensitivity) virtually constant.

16 Claims, 26 Drawing Sheets

| TPC COMMAND | TRANSMISSION POWER CONTROL RANGE | | | | | |
|---|---|---|---|---|---|---|
| | 1dB STEP SIZE | | 2dB STEP SIZE | | 3dB STEP SIZE | |
| | LOWER SIDE | UPPER SIDE | LOWER SIDE | UPPER SIDE | LOWER SIDE | UPPER SIDE |
| 1 | +0.5dB | +1.5dB | +1dB | +3dB | +1.5dB | +4.5dB |
| 0 | −0.5dB | +0.5dB | −0.5dB | +0.5dB | −0.5dB | +0.5dB |
| −1 | −0.5dB | −1.5dB | −1dB | −3dB | −1.5dB | −4.5dB |

| TARGET STEP SIZE | STEP SIZE TOLERANCES |
|---|---|
| 0dB | +/−0.5dB |
| 1dB | +/−0.5dB |
| 2dB | +/−1.0dB |
| 3dB | +/−1.5dB |
| 4−10dB | +/−2.0dB |
| 11−15dB | +/−3.0dB |
| 16−20dB | +/−4.0dB |
| ≥21dB | +/−6.0dB |

MOST RESTRICTIVE

| TPC COMMAND GROUP | TRANSMISSION POWER CONTROL RANGE AFTER 10 EQUAL TPC COMMAND GROUPS ARE PERFORMED | | | | | | TRANSMISSION POWER CONTROL RANGE AFTER 7 EQUAL TPC COMMAND GROUPS ARE PERFORMED | |
|---|---|---|---|---|---|---|---|---|
| | 1dB STEP SIZE | | 2dB STEP SIZE | | 3dB STEP SIZE | | 3dB STEP SIZE | |
| | LOWER SIDE | UPPER SIDE | LOWER SIDE | UPPER SIDE | LOWER SIDE | UPPER SIDE | LOWER SIDE | UPPER SIDE |
| +1 | +8dB | +12dB | +16dB | +24dB | N/A | N/A | +16dB | +26dB |
| 0 | +1dB | +1dB | −1dB | +1dB | N/A | N/A | −1dB | +1dB |
| −1 | −8dB | −12dB | −16dB | −24dB | N/A | N/A | −16dB | −26dB |
| 0,0,0,+1 | +6dB | +14dB | N/A | N/A | N/A | N/A | N/A | N/A |
| 0,0,0,−1 | −6dB | −14dB | N/A | N/A | N/A | N/A | N/A | N/A |

IN THIS TABLE, THESE REQUIREMENTS ARE THE MOST RESTRICTIVE (AFTER 10 EQUAL STEPS WHICH ARE EACH 1 dB ARE PERFORMED, POWER DIFFERENCE MUST BE WITHIN 10 ± 2 dB)

FIG.6

POLAR MODULATION TRANSMISSION APPARATUS

BACKGROUND OF THE INVENTION

1. Field of the Invention

The present invention relates to a technique of reducing the output power difference in a polar modulation transmission apparatus.

2. Description of the Related Art

FIG. 1 shows an example of a typical transmission apparatus using a polar modulation scheme. The transmission apparatus has polar signal generation circuit 1, amplitude control circuit 2, phase modulated signal generation circuit 3 and power amplifier (hereinafter "PA") 4. In this transmission apparatus, polar signal generation circuit 1 generates an amplitude component signal and a phase component signal of a modulated transmission signal from an input signal (i.e. the modulated transmission signal). Amplitude control circuit 2 controls the power supply voltage supplied to PA 4 based on the amplitude component signal, and phase modulated signal generation circuit 3 generates a phase modulated signal inputted to PA 4 based on the phase component signal.

This transmission apparatus secures the dynamic range of transmission power by switching between compressed mode and uncompressed mode in PA 4. Further, compressed mode may be rephrased as "saturation operation mode" and uncompressed mode as "non-saturation operation mode."

This transmission apparatus operates PA 4 in compressed mode when high transmission power is required. On the other hand, when low transmission power is required, the transmission apparatus operates PA 4 in uncompressed mode. To be more specific, in compressed mode, the transmission apparatus controls the output power by changing the level of the power supply voltage to PA 4 according to predetermined output power. Given that the PA operates in the saturation region, this compressed mode is inherently very accurate with respect to output power.

On the other hand, in uncompressed mode, the transmission apparatus controls the output power by changing the level of the phase modulated signal inputted to PA 4 according to predetermined output power. In this uncompressed mode, given that the PA operates in the linear region, the output power is not controlled as accurately as in compressed mode.

With conventional transmission apparatuses, when compressed mode ("c-mode") and uncompressed mode ("u-mode") are switched in transmission power control, transmission power drift is likely to occur due to differences between the characteristics of the modes (i.e. drift due to temperature, drift due to wear, and drift due to load, etc.).

This will be explained briefly using FIG. 2. As shown in FIG. 2, the output power in compressed mode is relatively accurate, but the output power in uncompressed mode changes due to drift (i.e. drift due to temperature, drift due to wear, and drift due to load, etc.).

As shown in FIG. 2, given that the output power in uncompressed mode is likely to drift due to various factors, when compressed mode and uncompressed mode are switched, the output power in uncompressed mode is likely to be discontinuous, and, as a result, significant drift of transmission power is likely to occur.

By the way, one method of controlling transmission power accurately is to measure the actual output power of a power amplifier and perform a feedback control of output power such that this measurement value becomes equal to a set target value.

Generally, for this feedback control, the method of eliminating modulation fluctuation components resulting from transmission data from the output of the power amplifier using a low-pass filter, is employed. Then, transmission power is adjusted again based on the difference between the set target value and average transmission power from which modulation fluctuation components are eliminated.

Here, more modulated components can be eliminated by setting the time constant of the low-pass filter bigger, so that more accurate transmission power control is possible.

On the other hand, if the time constant of a low-pass filter is set bigger, the response of the low-pass filter becomes poorer, and, accompanying this, the responsivity of feedback control becomes poorer. Given that there are wireless communication standards that require completing transmission power control in a very short period, in practice, the time constant of the low-pass filter cannot be set too big.

Particularly, when the above compressed mode and uncompressed mode are switched, feedback control of a higher rate is needed, and so it becomes even more difficult to make the time constant of the low-pass filter big.

SUMMARY OF THE INVENTION

It is therefore an object of the present invention to provide a polar modulation transmission apparatus that realizes accurate transmission power control in feedback control of the output power of a power amplifier.

The present invention achieves the above object by improving the accuracy of power measurement in a detector that detects the output power of the power amplifier.

The inventors of the present invention have found out that the sensitivity of the detector, which detects the output power of the power amplifier, varies depending on the $\beta$ parameter, which shows the ratio of the signal scale of control channel $\beta c$, the signal scale of data channel $\beta d$ and the signal scale of high speed control channel $\beta hs$, and focused upon this variation of sensitivity.

Further, the inventors have focused upon that, when the $\beta$ parameter changes, the output characteristics of the detector change with respect to the PAPR (Peak to Average Power Ratio) of the complex signal (IQ signal) which is outputted from the spreading modulating section and which is inputted to the polar modulation transmission apparatus. Further, the inventors have found out that, by compensating for a power detection result in the detector according to the PAPR of the complex signal, it is possible to improve the accuracy of power measurement, and, consequently, realize accurate transmission power control in the entire polar modulation transmission apparatus, and arrived at the present invention.

An aspect of the polar modulation transmission apparatus according to the present invention that inputs a phase modulated signal generated from a phase component of an input complex signal to a signal input port of a power amplifier and that inputs a power supply voltage, which is adjusted by an amplitude modulated signal generated from an amplitude component from the input complex signal, to a power supply input port of the power amplifier, employs a configuration including: a detector that detects an output power of the power amplifier; a peak to average power ratio calculating section that calculates a peak to average power ratio of the input complex signal; a compensation value generating section that outputs a compensation value corresponding to the calculated peak to average power ratio; an arithmetic operation section that performs an arithmetic operation using the compensation value and a detection result obtained by the detector; and a transmission power control section that, by scaling the phase modulated signal and the power supply voltage based on an arithmetic operation result obtained by the arithmetic operation section, controls the output power of the power amplifier.

BRIEF DESCRIPTION OF THE DRAWINGS

FIG. 6 shows cumulative power control tolerances for power commands in each group according to the 3GPP UMTS standard;

FIG. 15 shows the relationships between the actual PA output and the ADC output under several β parameters after the ADC output sensitivity is compensated for;

FIG. 16 shows the relationships between the PAPR of the spread modulated signal and the ADC output after the ADC output sensitivity is compensated for;

DETAILED DESCRIPTION OF THE PREFERRED EMBODIMENT

Embodiments of the present invention will be described in detail with reference to the accompanying drawings.

(1) Overall Configuration

Figure 1:
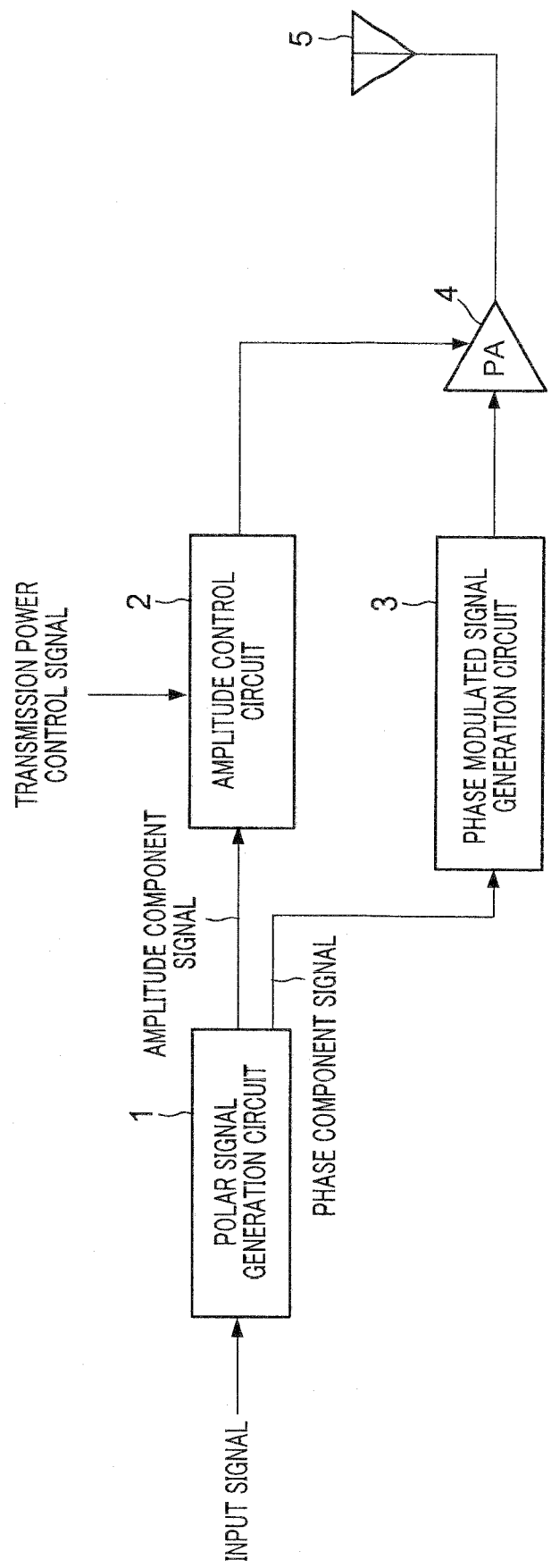
FIG. 1 is a block diagram showing an example of a typical transmission apparatus using the polar modulation scheme.
Figure 2:
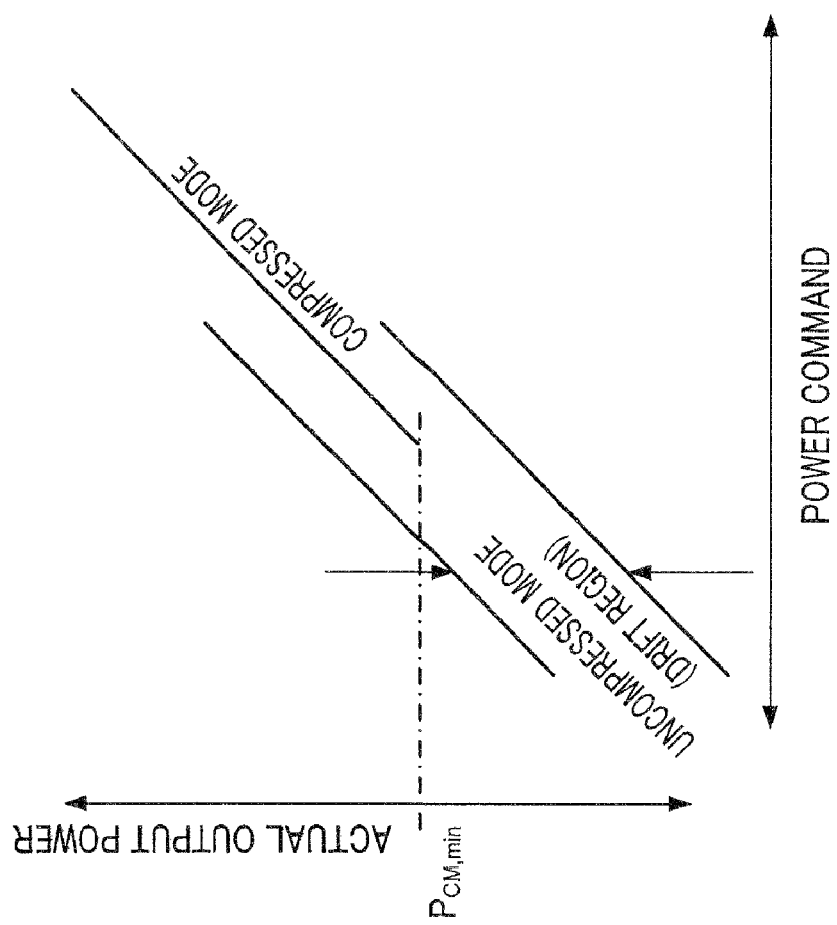
FIG. 2 illustrates drift of transmission power (i.e. discontinuity in output power) resulting from a mode switch.
Figure 3:
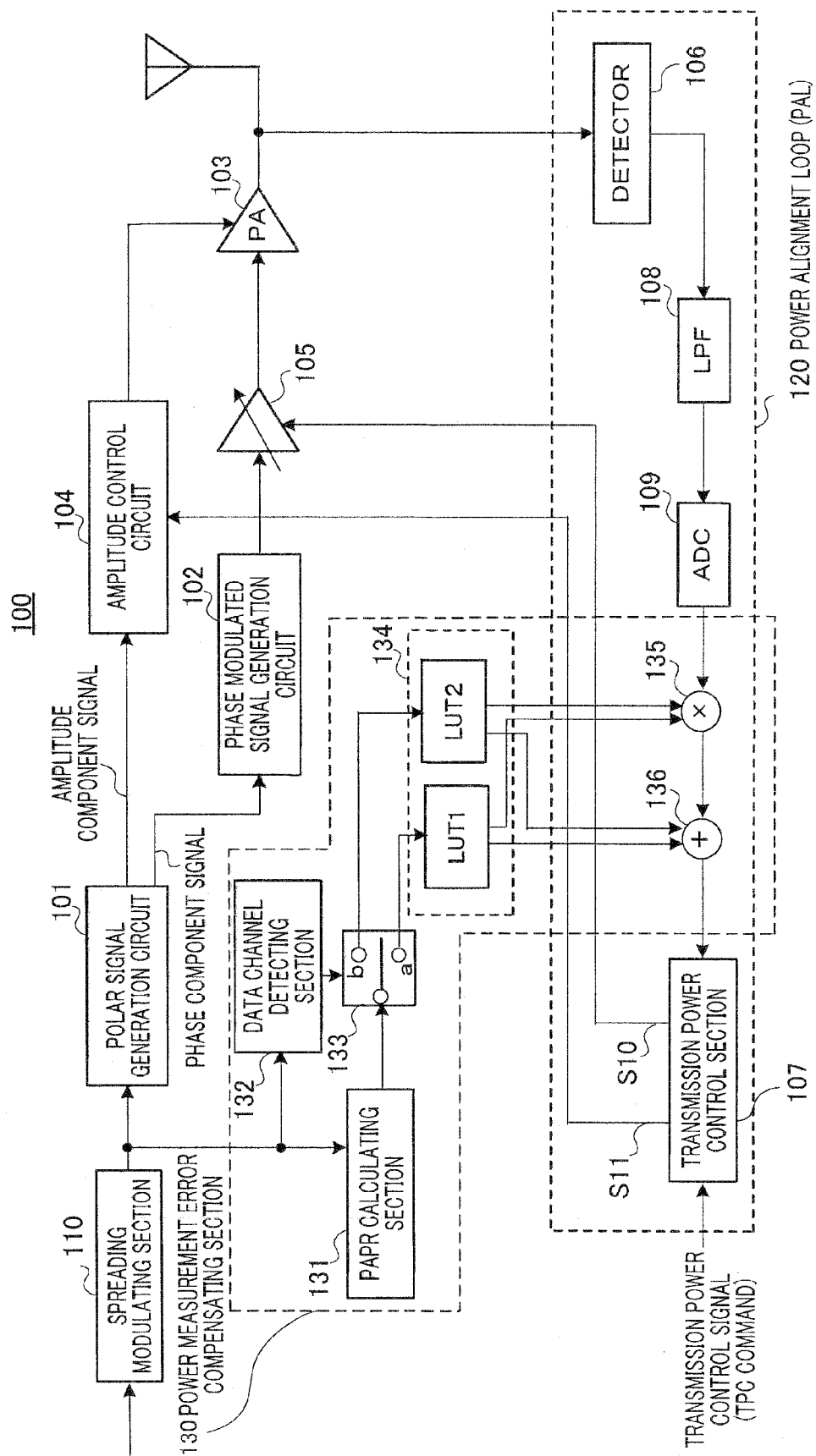
FIG. 3 is a block diagram showing a configuration of the polar modulation transmission apparatus according to the embodiment of the present invention.

FIG. 3 shows the configuration of the polar modulation transmission apparatus according to an embodiment of the present invention. Polar modulation transmission apparatus 100 of FIG. 3 has polar signal generation circuit 101, phase modulated signal generation circuit 102, power amplifier (PA) 103, amplitude control circuit 104, variable amplifier 105 formed with a variable gain amplifier (VGA) and/or an attenuator, and power alignment loop (PAL) 120.

Power alignment loop 120 has detector 106 that detects the output power of PA 103, low-pass filter (LPF) 108, analogue-to-digital converter (ADC) 109 and transmission power control section 107.

Further, in power alignment loop 120, arithmetic operators (multiplier 135 and adder 136) which are part of the components of power measurement error compensating section 130 (described later), are provided.

Polar signal generation circuit 101 receives as input a spread modulated signal (i.e. input complex signal) obtained by spreading modulating section 110. Polar signal generation circuit 101 generates an amplitude component signal and a phase component signal from the spread modulated signal as the input complex signal. To be more specific, polar signal generation circuit 101 operates according to the input complex signal from spreading modulating section 110, and generates an envelope component signal (i.e. amplitude component signal) containing the amplitude information of the input complex signal, and a constant-envelope component signal (i.e. phase component signal) containing the phase information of the input complex signal. The amplitude component signal is inputted to amplitude control circuit 104 and the constant amplitude phase component signal is inputted to phase modulated signal generation circuit 102.

Phase modulated signal generation circuit 102 generates an RF phase modulated signal from the phase component signal. Variable amplifier 105 amplifies or attenuates the RF phase modulated signal based on a phase path scaling coefficient (i.e. phase-path magnitude scaling) S10 obtained at transmission power control section 107, and then supplies the scaled RF phase modulated signal to the RF signal input terminal of PA 103.

Amplitude control circuit 104 forms power supply voltage for PA 103 by multiplying the amplitude component signal by an amplitude path scaling coefficient (i.e. AM-path envelope scaling) S11 from transmission power control section 107, and supplies this power supply voltage to the power supply input terminal of PA 103.

Detector 106 is formed with, for example, PIN diodes or other semiconductor detectors, and detects the output power of PA 103.

LPF 108 is formed with, for example, an RC circuit and obtains an average output power value of PA 103 by integrating output power detection results from PA 103. LPF 108 is provided to reduce fluctuation of the output power detection value of PA 103 obtained by detector 106.

By the way, if the cut-off frequency of LPF 108 is set too high, fluctuation cannot be reduced sufficiently.

On the other hand, if the cut-off frequency is set too low, the output of LPF 108 after power adjustment takes time to become stable, which then makes it difficult to finish power control in, for example, the time designated by the 3GPP standard. By the way, according to the 3GPP standard, power control is required to be performed within a range of ±25 µsec from the symbol boundary.

Further, when residual fluctuation components are included in an input signal itself (an input signal to polar signal generation circuit 101 of FIG. 3), even if the above feedback control is performed, it is difficult to control transmission power accurately. A case will be explained below as an example where HSUPA (High Speed Uplink Packet Access) signals are input signals. HSUPA is the next-generation technique related to uplink in UMTS/WCDMA which is standardized by the 3GPP.

Here, the output waveform of PA 4 will be explained when an HSUPA signal is inputted as an input signal to polar signal generation circuit 101. Wideband fluctuation components are included in the amplitude component signal after spreading modulation, by means of a spreading pattern or a spreading code gain factor, and fluctuation of the lower-frequency component cannot be eliminated by a low-pass filter.

Figures 4, 5:
FIG. 4 shows power control tolerances for output power step size commands according to the 3GPP UMTS standard.
FIG. 5 lists tolerance step sizes.

For example, according to 3GPP (3rd Generation Partnership Project) 25.101, differences in transmission power need to fulfill the requirements shown in FIG. 4 to FIG. 6.

This will be explained in detail. 3GPP, which is the standards body responsible for promulgating the UMTS and W-CDMA standards, requires that, a mobile terminal increase or decrease output power in discrete steps(e.g.,+/−1 dB, +/−2 dB, +/−3 dB, and etc.) according to TPC commands from a base station. The UMTS standard also specifies implementing these power increasing and decreasing steps within specific tolerances.

For example, as shown in the table of FIG. 4, in case of a TPC command for increasing and decreasing output power by a +/−1 dB step, the resulting output power is required to be within +/−0.5 dB of the target output power. Then, for example, if the transmission apparatus of a mobile terminal operates at 0 dBm and receives a TPC command for "1," the transmission apparatus of the mobile terminal must adjust the transmission power to be within the range between +0.5 dBm and 1.5 dBm. Wider tolerances of +/−1 dB and +/−1.5 dB are permitted for larger step sizes of 2 dB and 3 dB.

The 3GPP UMTS standard also specifies cumulative tolerances for power command groups, as shown in the table in FIG. 6. It is required that, for, for example, ten TPC commands each configured with 1 dB step size, the resulting output power level be within +/−2 dB of the target output power level.

As shown in the list of the table of FIG. 4 and FIG. 5, the most restrictive step size for a single TPC command is a TPC command indicating +/−1 dB (i.e. +/−0.5 dB tolerance is required).

If the accuracy of power measurement deteriorates due to the above residual fluctuation components resulting from spreading modulation, the above requirements are less likely to be fulfilled.

In fact, according to the 3GPP standard, power control is required to be performed within a range of ±25 µsec from the symbol boundary.

To meet this requirement, the time constant of LPF 108 needs to be several µsec or less. In practice, the time constant of LPF 108 needs to be set such that instantaneous envelope fluctuation of a spread modulated signal can be canceled, and fluctuation slower than the fundamental period of the spread modulated signal (i.e. the chip rate for the spreading code) resulting from the pattern of the spreading code used in spreading modulating section 110 may remain. The cut-off frequency is preferably in the range of several dozens to hundreds of kHz. In the present embodiment, as an example, the cut-off frequency is 300 kHz.

ADC 109 samples output results of LPF 108.

Transmission power control section 107 receives as input the output of detector 106 through LPF 108, ADC 109, multiplier 135 and adder 136. Further, transmission power control section 107 checks whether or not a transmission power control signal is reported from the communicating party (for example, a base station, but not shown), and, if are port is received, sets transmission control power value ΔP of the next symbol in the symbol boundary. Furthermore, the transmission power control signal needs not to be reported from the communicating party, and may be generated inside the terminal having the polar modulation transmission apparatus.

Transmission power control section 107 calculates scaling coefficients S10 and S11 based on the output power measurement value in PA 103 and transmission power control value ΔP, and outputs scaling coefficients S10 and S11 to amplitude control circuit 104 and to variable amplifier 105, respectively, and thereby controls the power supply voltage level of PA 103 and the input signal (i.e. RF phase modulated signal) level of PA 103.

To be more specific, transmission power control section 107 calculates final scaling coefficients S10 and S11 by using the original values of the scaling coefficients obtained with reference to a table using the transmission power set values as addresses, and the compensation values of the scaling coefficients determined from the output power measurement values of detector 106, LPF 108 and ADC 109.

Transmission power control section 107 of the present embodiment has a table associating TPC commands with scaling coefficients (hereinafter referred to as the "power table").

Figure 7:
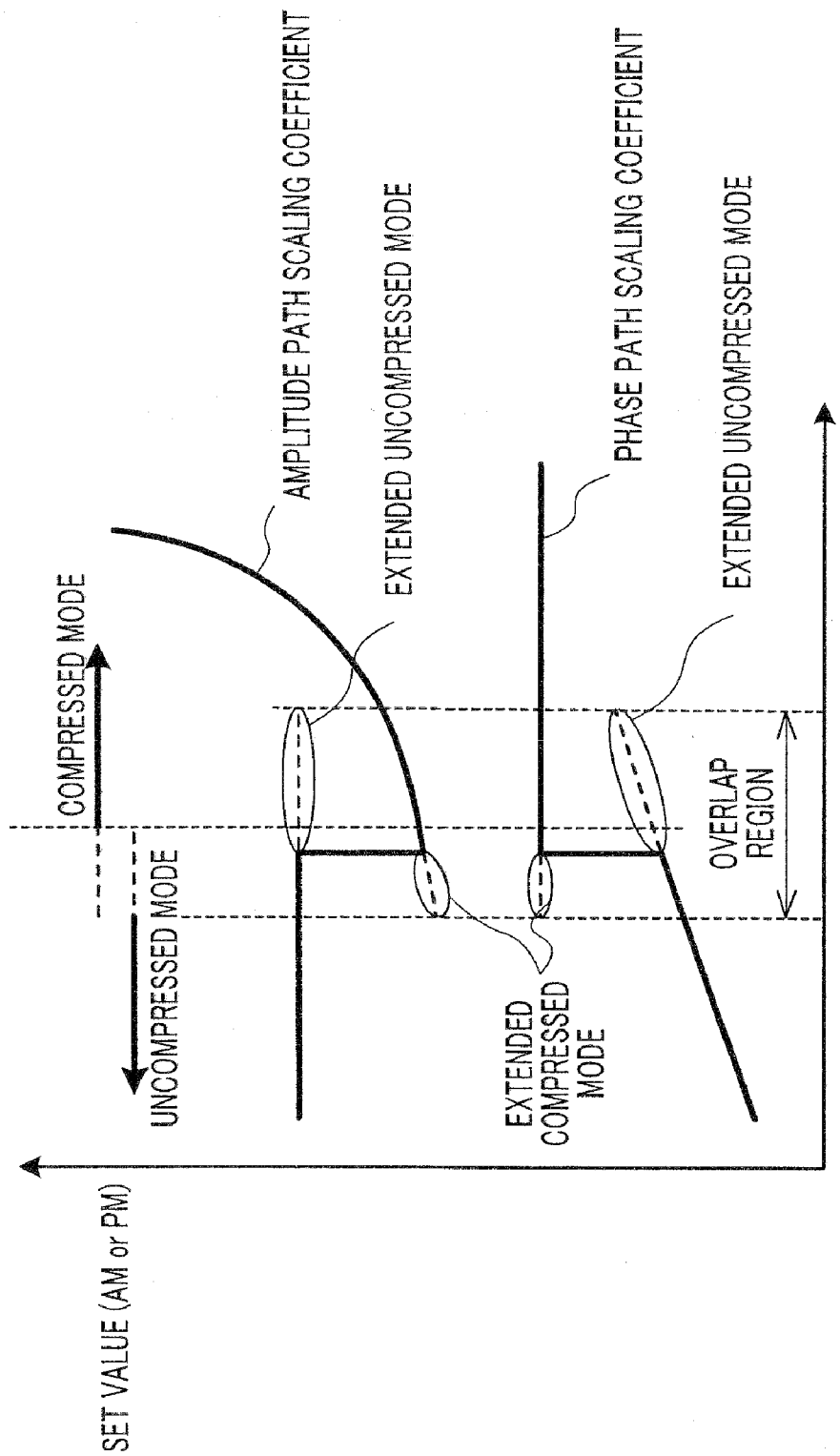
FIG. 7 illustrates a set of scaling coefficients provided in a transmission power control section.

FIG. 7 illustrates a set of scaling coefficients of the power table provided in transmission power control section 107. In compressed mode, the output power of polar modulation transmission apparatus 100 is controlled based on the power supply voltage that is subjected to amplitude modulation and that is given to the collector (or drain) node of PA 103, and the power of the phase modulated RF signal with a constant amplitude, is kept constant. In uncompressed mode, the output power of PA 103 is controlled by keeping constant the scaling coefficient multiplied upon the envelope of the amplitude path and changing the scaling coefficient multiplied upon the drive signal in the phase path. However, in either operation mode, the scaling coefficient that is not used in power control (that is, in compressed mode, the phase path scaling coefficient multiplied upon the phase modulated RF signal, and, in uncompressed mode, the amplitude path scaling coefficient multiplied upon the envelope of the amplitude path), does not need to be kept constant, and may be adjusted to compensate for the output power or improve the output distortion characteristics or noise characteristics of PA 103.

In practice, as shown in FIG. 7 transmission power control section 107 has a set of compressed mode scaling coefficients and a set of uncompressed mode scaling coefficients. In case of the present embodiment, near the boundary between compressed mode and uncompressed mode, an overlapping region where the set of compressed mode scaling coefficients and the set of uncompressed mode scaling coefficients are set, is provided.

Whether compressed mode or uncompressed mode is selected, the overlapping region is where required output power can be generated. To be more specific, in practice, compressed mode and uncompressed mode can be realized by providing the amplitude path scaling coefficient and phase path scaling coefficient such as shown by the solid lines in FIG. 7. However, with the present embodiment, the set of scaling coefficients shown by the dotted lines is provided in addition to the set of scaling coefficients shown by the solid lines. Consequently, an overlapping region where the compressed mode region and the uncompressed mode region are extended to enable PA 103 to operate in either compressed mode or uncompressed mode, is provided.

In this way, whether PA 103 operates in compressed mode or in uncompressed mode is determined according to scaling coefficients S10 and S11 calculated by transmission power control section 107.

As explained above, by measuring the output power of PA 103 by power alignment loop 120 and selecting amplitude path scaling coefficients S11 and phase path scaling coefficients S10, polar modulation transmission apparatus 100 of the present embodiment is able to reduce the discontinuity (in particular, discontinuity upon mode transition) in the output power of PA 103 when transmission power changes.

(2) Compensation for the Output Power Measurement Errors Due to the β Parameter

In addition to the above configuration, polar modulation transmission apparatus 100 of the present invention has power measurement error compensating section 130.

Power measurement error compensating section 130 has PAPR (Peak to Average Power Ratio) calculating section 131, data channel detecting section 132, output selecting switch 133, compensation value generating section 134 and arithmetic operators (multiplier 135 and adder 136).

PAPR calculating section 131 receives as input a spread modulated signal outputted from spreading modulating section 110 and calculates the peak to average power ratio value of this spread modulated signal. The calculated PAPR value is outputted to compensation value generating section 134 through selecting switch 133.

Data channel detecting section 132 receives as input the spread modulated signal and detects whether or not the signal of the data channel is included in one slot for the spread modulated signal based on the signal point constellation of the spread modulated signal which is a complex signal. To be more specific, if the absolute value of the I-component of the spread modulated signal is equal to the absolute value of the Q-component, it is decided that the signal of the data channel is not included. Data channel detecting section 132 controls output selecting switch 133 based on a detection result.

To be more specific, if the data channel is included, output terminal a of output selecting switch 133 is selected, and thereby the PAPR value is outputted to lookup table 1 (LUT1) of compensation value generating section 134 through output selecting switch 133. By contrast with this, if the data channel is not included, output terminal b of output selecting switch 133 is selected, and thereby the PAPR value is outputted to lookup table 2 (LUT2) of compensation value generating section 134.

LUT1 and LUT2 store compensation values (compensation coefficients) corresponding to the PAPR values and output the compensation values using the PAPR values as read addresses to multiplier 135 and adder 136. These compensation values will be described later.

In this way, by providing power measurement error compensating section 130, it is possible to compensate for the sensitivity of detector 106 resulting from the variation of the β parameter and the difference between modes and by reducing the power measurement error, it is possible to improve the accuracy of power measurement.

Figure 8:
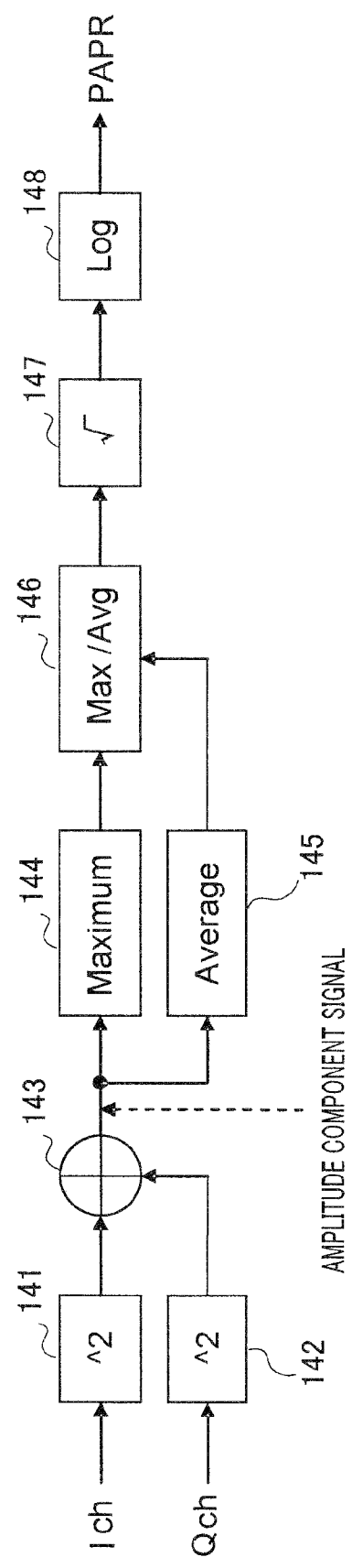
FIG. 8 is a block diagram showing a configuration example of a PAPR calculating section.

FIG. 8 shows a configuration example of PAPR calculating section 131. PAPR calculating section 131 receives as input the I-ch signal and the Q-ch signal after spreading modulation. As a result of calculation in square calculating sections 141 and 142 and adding section 143, $I^2+Q^2$ is outputted from adding section 143. Maximum section 144 detects the maximum value of $I^2+Q^2$ in a predetermined period, and average section 145 calculates the average value of $I^2+Q^2$ in a predetermined period. Next, maximum/average calculating section 146 finds the ratio of the maximum value to the average value, and square root calculating section 147 and logarithm calculating section 148 find the final PAPR value.

Further, the configuration of PAPR calculating section 131 is not limited to the configuration shown in FIG. 8. For example, as in $\max^2/(\max+\min)$, a method of determining an approximate PAPR may be used. Further, square calculating sections 141 and 142 and adding section 143 may be removed, and as shown by the dotted line in the figure, the PAPR may be determined using the amplitude component signal outputted from polar signal generation circuit 101. Further, if read addresses for LUT1 and LUT2 of compensation value generating section 134 are set as values obtained by taking into account the square root and logarithm in advance, square root calculating section 147 and logarithm calculating section 148 may be removed.

In fact, the power measurement error compensated for by power measurement error compensating section 130 is a relative power shift between measurement results of power measured at different times. Transmission power control section 107 performs control to relatively increase or decrease output power at different times. Consequently, what is significant to the output power measurement value is not the absolute accuracy at a specific time but is relative accuracy between times.

In polar modulation transmission apparatus 100 of the present embodiment, power measurement error compensating section 130 compensates for the sensitivity for the output power measurement value that varies depending on the β parameter and the measurement errors between modes that vary depending on the β parameter in, for example, spreading modulating section 110.

As a result, the transmission power control section is able to control transmission power (that is, determine the scaling coefficients) employing output power measurement of high relative accuracy, so that accurate transmission power control is possible.

To be more specific, even if the same power is actually outputted from PA 103, a phenomenon occurs where, resulting from the sensitivity of detector 106, LPF 108 and ADC 109, different measurement results are outputted from ADC 109 when the β parameter varies in spreading modulating section 110. In polar modulation transmission apparatus 100 of the present embodiment, power measurement error compensating section 130 is provided, so that it is possible to reduce the power measurement errors of when the β parameter varies.

(3) Compensation for Output Power Measurement Errors Upon Mode Transition

The operation of compensating for the output power errors between modes upon mode transition in polar modulation transmission apparatus 100 will be described using FIG. 9. Further, the operation of power measurement error compensating section 130 will be described later, and so the operation of PAL 120 without the operation of power measurement error compensating section 130 will be described.

Figure 9:
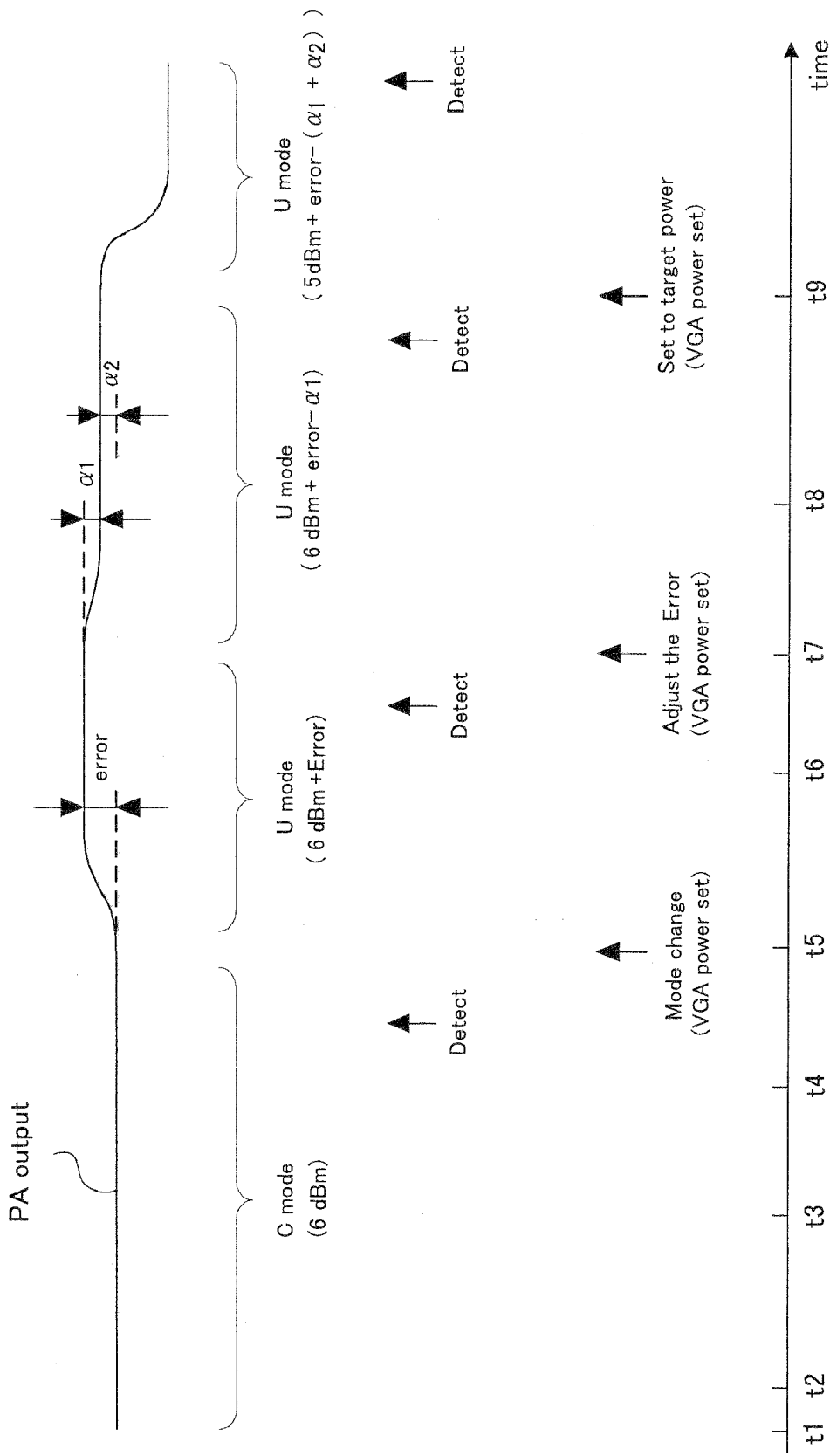
FIG. 9 illustrates the output power error compensating operation between modes upon mode transition.

Although mode transition refers to a case where compressed mode (C mode) transitions to uncompressed mode (U mode) or a case where uncompressed mode transitions to compressed mode, FIG. 9 shows a case as an example where compressed mode transitions to uncompressed mode.

Further, FIG. 9 shows a case where output power is decreased by 1 dBm from the current output power (that is, a case where an output power command of −1 dBm is inputted as a transmission power control signal).

First, PAL 120 starts power control at time t1. Further, the output power command is inputted prior to time t1. PAL 120 operates detector 106 at time t2. Then, after the settling time of detector 106 from time t3 to time t4 passes, the output power measurement value of PA 103 is obtained in present mode (compressed mode (C mode)) based on the output of ADC 109 from time t4. FIG. 9 shows a case where the output power measurement value is 6 dBm.

Next, by inputting a new scaling coefficient S10 to VGA 105 by transmission power control section 107 at time t5, PA 103 is allowed to transition to uncompressed mode (U mode). In practice, in the sets of scaling coefficients shown in FIG. 7, a set of scaling coefficients S10 and S11 is selected such that mode is allowed to transition to uncompressed mode without changing the output power value of PA 103 and a set of scaling coefficients S10 and S11 is outputted to VGA 105 and amplitude control circuit 104, so that mode transition is realized.

Next, after the settling time of detector 106 passes, PAL 120 obtains an output power measurement value in uncompressed mode based on the output of ADC 109 at time t6. FIG. 9 shows a case where the output power measurement value is 6 dBm+error. In this way, although this output power detection value must be 6 dBm (because such a set of scaling coefficients is selected), as described above, the detection value is shifted from 6 dBm by the error due to the output errors of PA 103 between modes and the measurement errors of the measurement system.

Then, by selecting a set of scaling coefficients S10 and S11 that can cancel the error at time t7 and outputting scaling coefficient S10 to VGA 105 and scaling coefficient S11 to amplitude control circuit 104, transmission power control section 107 sets the power of VGA 105 and amplitude control circuit 104 (corresponding to adjust the error in FIG. 7).

Next, after the settling time of detector 106 passes, transmission power control section 107 obtains the output power measurement value based on the output of ADC 109 from time t8. FIG. 9 shows a case where the output power measurement value is 6 dBm+error−a1. In this case, a1 is the actual power change amount of the output power measurement value when power adjustment is carried out with respect to the error using a set of scaling coefficients S10 and S11. Further, a2 is the actual amount of power adjustment when power adjustment is carried out with respect to the residual error (error−a1).

Transmission power control section 107 sets the target power at time t9 taking into account that the power command designates "−1 dBm" and the amount of power adjustment is a2, and selects a set of scaling coefficients S10 and S11 that can produce the target power. Transmission power control section 107 outputs the set of scaling coefficients S10 and S11 to VGA 105 and amplitude control circuit 104, respectively. By this means, the output power of PA 103 is 5 dBm+error−(a1+a2). In an ideal case, error−(a1+a2) is zero. In this way, the output power from which the error due to mode transition is canceled, is produced.

(4) The Principle of Compensating for the Power Measurement Error and the Operation of Power Measurement Error Compensating Section 130

Next, the principle of the power measurement error compensation, which is a feature of the present invention, and the operation of power measurement error compensating section 130 will be described.

Here, as described above, in the polar modulation transmission apparatus, a power setting value is set such that the same output power is produced even if mode is changed, and, nevertheless, there are cases where an output error occurs.

One of the factors that produce such output error is the output power measurement error resulting from the performance of detector 106. For example, when diode detection is performed in detector 106, the detection error occurs due to diode detection performance. That is, although the same power is actually outputted from PA 103, it is decided that varying power is outputted due to a detection error of detector 106. As a result, transmission power control section 107 controls power based on wrong power measurement values, and therefore causes an output error.

By the way, when the β parameter and mode are changed, no problem is presented if an output of ADC 109 is shifted by the same value regardless of an output level of the power amplifier. That is, no problem is presented if the ADC sensitivity with respect to output level Pout of the power amplifier is constant. However, as described above, when the β parameter varies in spreading modulating section 110, the ADC sensitivity varies, and therefore accurate power control in transmission power control section 107 is difficult.

The relationship between the β parameter and the power measurement value will be described below.

Figure 10:
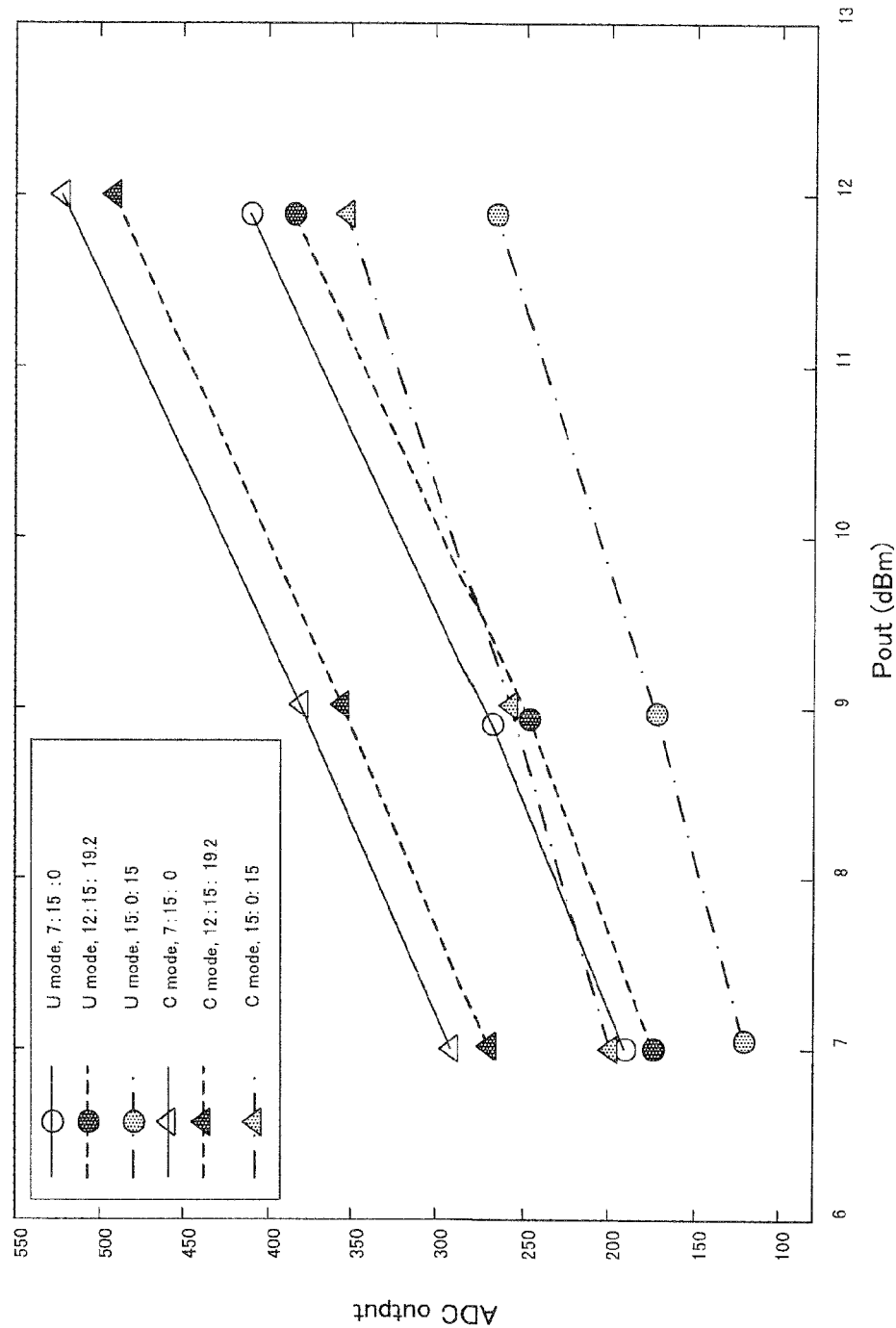
FIG. 10 shows the relationships between the actual PA output and the ADC output under several β parameters.

FIG. 10 shows the relationships between the actual PA output (Pout) and the ADC output (ADC output) under several β parameters. As shown in FIG. 10, even if the output power of PA 103 is the same, the output of ADC 109 varies depending on differences between β parameters and differences between modes.

The β parameter shows the ratio of the scales of three channel signals. The three signals include control channel βc, data channel βd and high speed control channel βhs. That is, the β parameter is represented by βc: βd: βhs. If the β parameter varies, the characteristics of the IQ signal outputted from spreading modulating section 110 vary depending on the β parameter.

As shown in FIG. 10, first, if mode is the same and the β parameter varies, different values are outputted from ADC 109 even if the output power of PA 103 is the same. Secondly, if the β parameter is the same and mode varies, different values are outputted from ADC 109 even if the output power of PA 103 is the same.

Originally, if the β parameter and mode vary and the output power of PA 103 is the same, preferably, the same value is outputted from ADC 109. That is, if the β parameter and mode vary and output power of PA 103 is the same, different values are outputted from ADC 109 and it is not preferable that transmission power is controlled based on this ADC output value.

In practice, what is significant in PAL control is the inclination of each straight line in FIG. 10. That is, in PAL control, if the relationships between changes in PA output and changes in ADC output can be learned, PA output can be accurately increased or decreased by transmission power control commands (i.e. the difference between PA outputs) according to the difference between ADC outputs.

However, the inclinations of the straight lines in FIG. 10 (i.e. the relationships between changes in PA output and changes in ADC output) are not always the same. For example, the inclinations of some of the straight lines vary if mode is the same and the β parameter varies. Further, the inclinations of some of the straight lines vary if the β parameter is the same and mode varies.

For this reason, in conventional PAL control, if the β parameter or mode varies, there was a possibility that the PA output cannot be accurately increased or decreased.

For example, the difference al in FIG. 9 is detected 0.5 dBm based on the ADC output, the actual PA output was likely to fluctuate above or below 0.5 dBm according to the variation of the β parameter or the variation of mode.

By the way, the β parameter changes in units of one slot at minimum, and, if one slot is 666 μsec, the β parameter is likely to change every 666 μsec. Further, the slot boundary of data channel β d and the slot boundary of control channel βc are the same, but, given that there are cases where the slot boundary of high speed control channel βhs is different from the above slot boundaries, the β parameter is likely to change in units of one symbol, which is a period shorter than one slot.

Further, with the present embodiment, as described above, the standard requires completing power control within ±25 μsec from the slot boundary (total 50 μsec).

Figure 11:
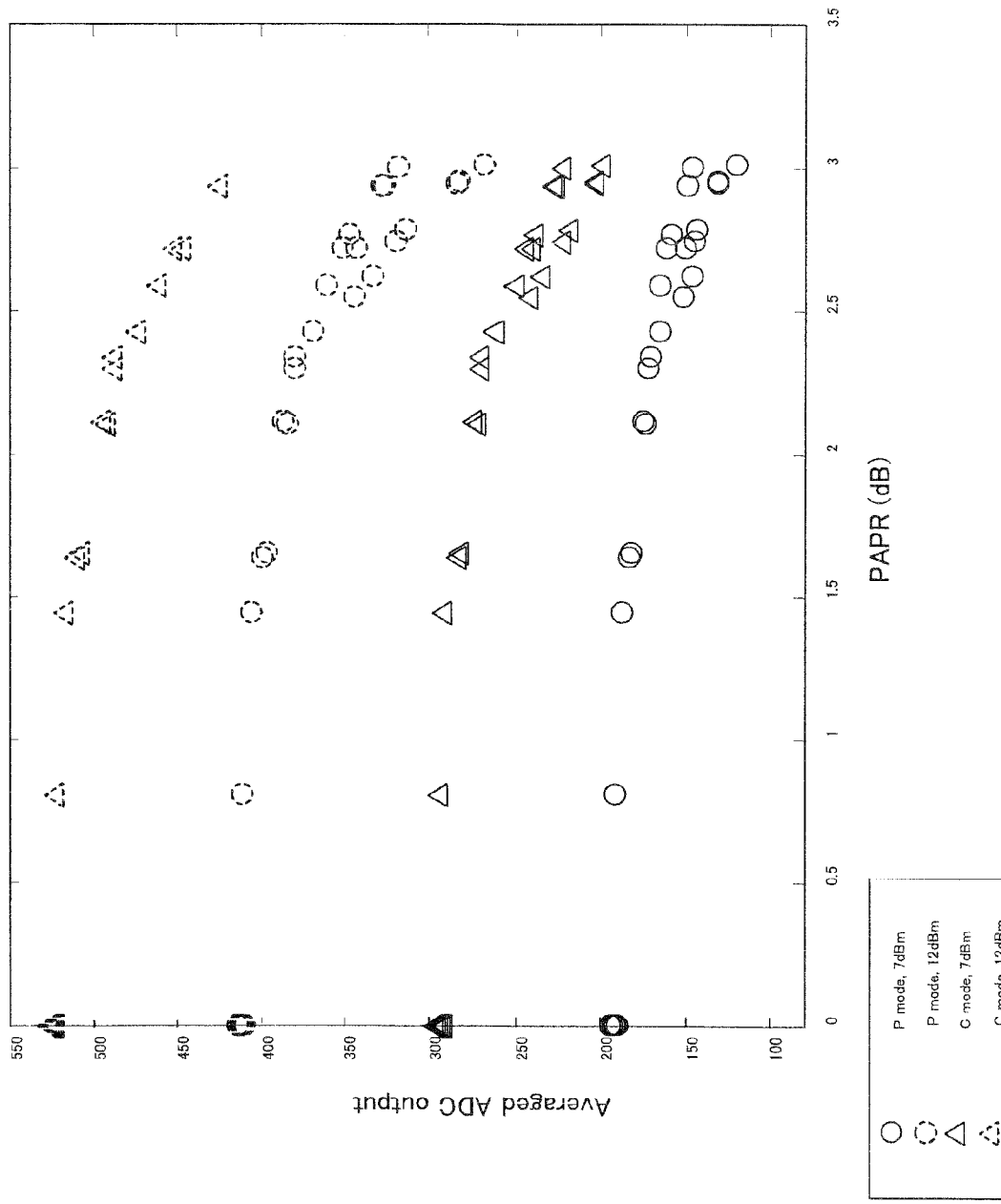
FIG. 11 shows the relationships between the PAPR of the spread modulated signal and the ADC output.

Furthermore, the inventors of the present invention have examined the relationship between the PAPR (Peak to Average Power Ratio) of the spread modulated signal outputted from spreading modulating section 110 and the ADC output. FIG. 11 shows the result. Further, FIG. 11 shows a result of a case where PA outputs are set as 7 dBm in compressed mode (C mode) and 12 dBm in uncompressed mode (U mode). Further, the averaged ADC output is a value obtained by averaging the output of ADC 109 only in one slot.

Here, it is known that, if the β parameter is the same, the PAPR is the same. By the way, there are combinations of β parameters in which, if the β parameter varies, the PAPR's are virtually the same. For example, a combination of 15:1:15 and 15:0:15 in FIG. 12 is one of combination examples.

Next, the inventors have examined the relationship between the PAPR of the spread modulated signal and ADC output sensitivity characteristics (or may be referred to as "detector sensitivity characteristics"). FIG. 12 shows the result. The vertical axis of FIG. 12 shows the amount of changes in the ADC output when the PA output is changed by 1 dB. FIG. 12 shows the relationships between the PAPR and the ADC output sensitivity under several β parameters.

Figure 12:
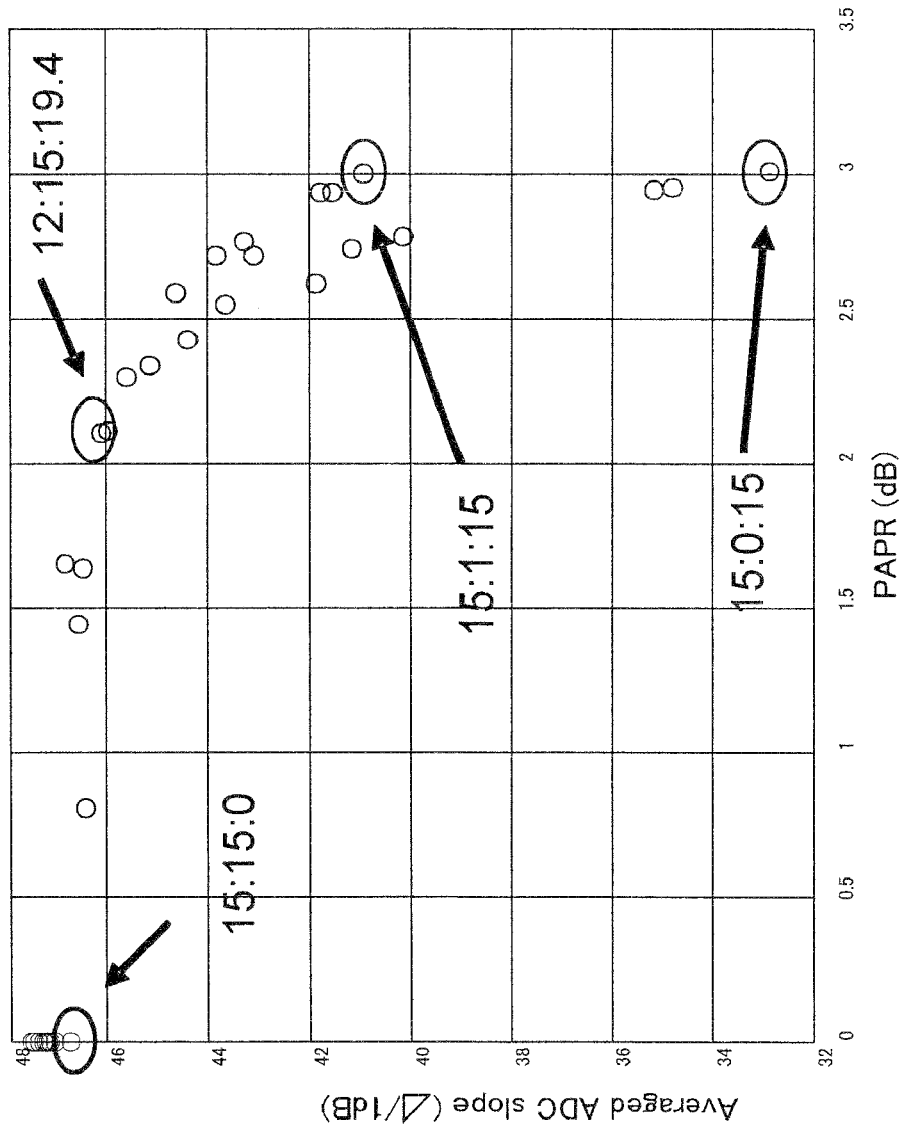
FIG. 12 shows the relationships between the PAPR of the spread modulated signal and ADC output sensitivity characteristics (detector sensitivity characteristics)

As shown in FIG. 12, the circles in FIG. 12 are distributed in the vicinity of a certain curve. Further, as in the β parameters of 15:1:15 and 15:0:15, the PAPR is the same (about 3 dB for both) but the ADC output sensitivity varies. Furthermore, if the β parameter varies, the ADC output sensitivity varies.

In practice, the β parameter is used in a baseband processing circuit including spreading modulating section 110, and this baseband processing circuit and an RF circuit including PAL 120 are likely to be provided in separate chips. Therefore, it is difficult for the RF circuit to receive the β parameter as is from the baseband processing section, and PAL 120 included in the RF circuit cannot learn the β parameter.

Then, the inventors have thought that, according to the above relationships in FIG. 12, by compensating for the ADC output sensitivity (the sensitivity of the detector) based on the PAPR of the spread modulated signal, it is possible to compensate for the ADC output differences resulting from the variation of the β parameter.

Figure 13:
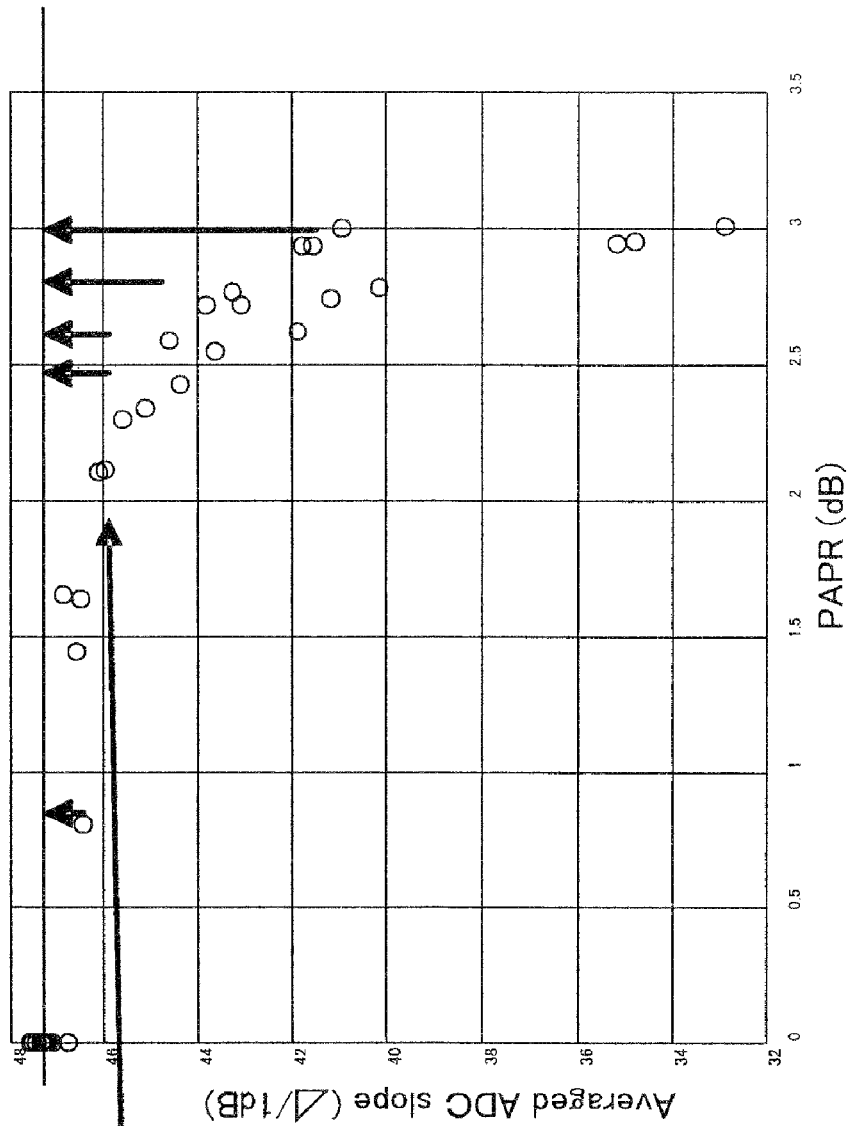
FIG. 13 illustrates compensation for ADC output sensitivity.
Figure 14:
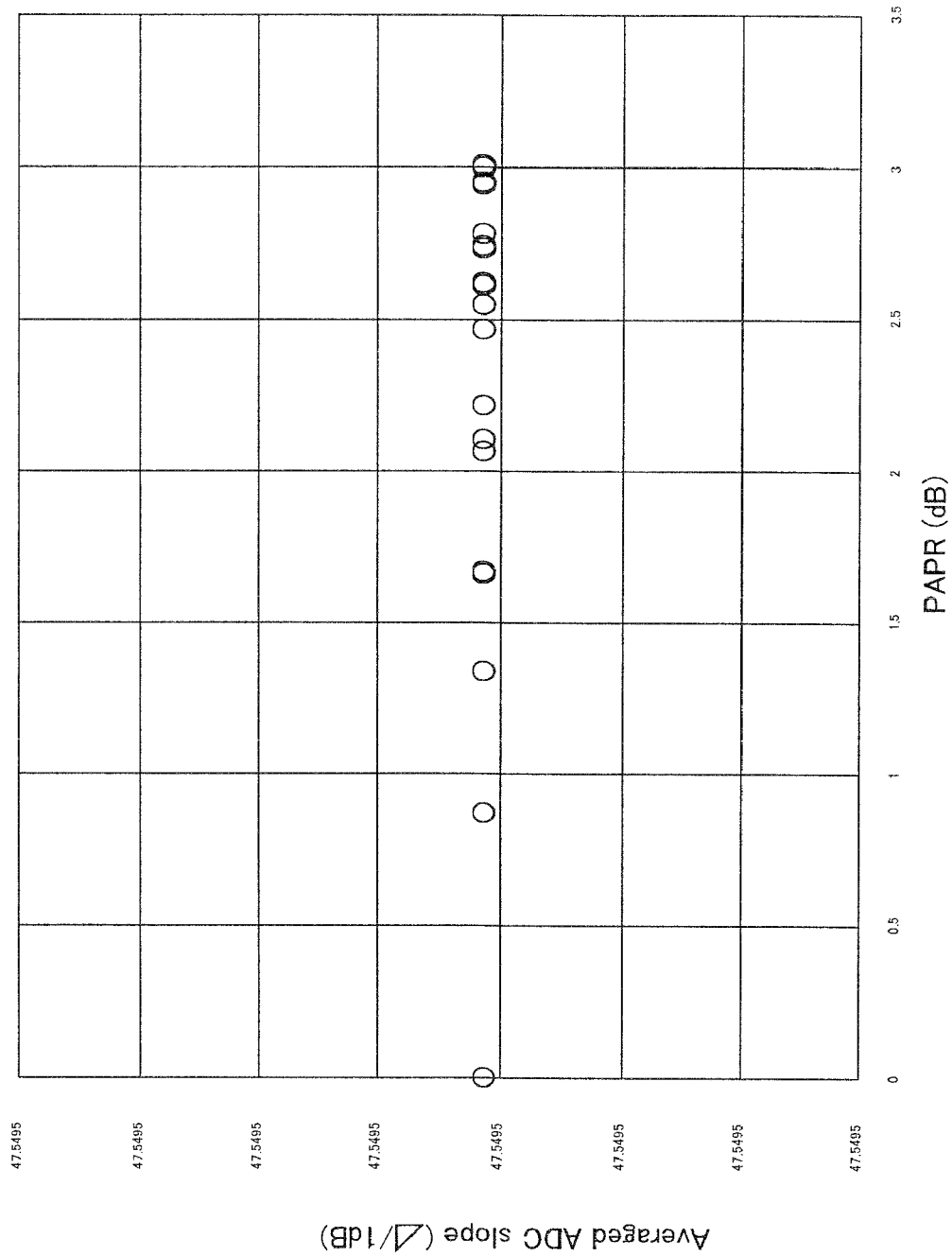
FIG. 14 shows ADC output sensitivity after compensation.

As the first method of compensating for the ADC output sensitivity resulting from the variation of β parameter, as shown in FIG. 13, the inventors have thought to prepare a compensation value (compensation coefficients) per PAPR in advance and multiply the ADC output by the compensation value corresponding to the measured PAPR, thereby making the ADC output sensitivity constant. FIG. 14 shows the result of such compensation.

Figure 15:
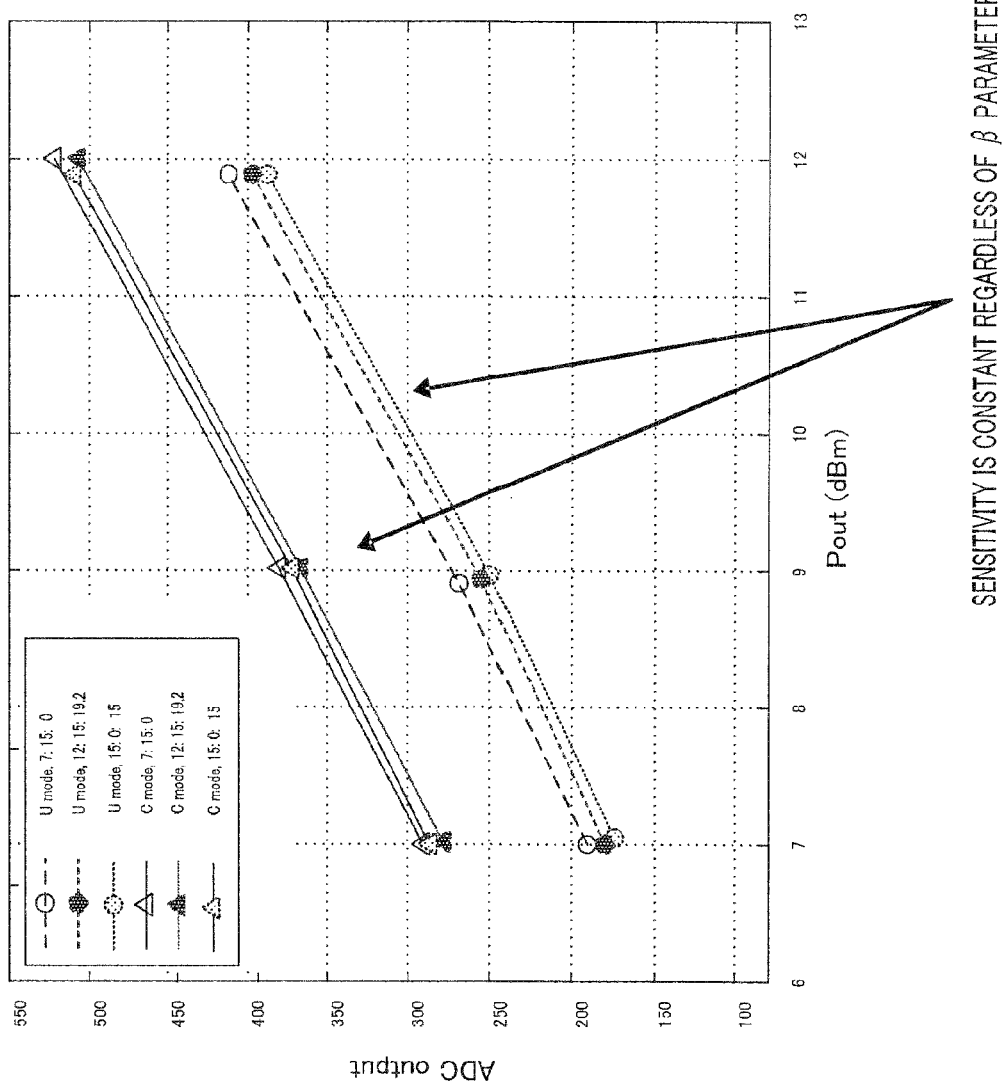

Further, FIG. 15 shows the relationships between actual PA outputs and ADC outputs under several β parameters after such compensation is carried out. As is clear upon comparison with FIG. 10, if mode is the same, it is possible to produce virtually equal ADC output for PA output even if the β parameter varies and the sensitivities (the inclinations of ADC output value with respect to PA output) are virtually the same.

Figure 16:
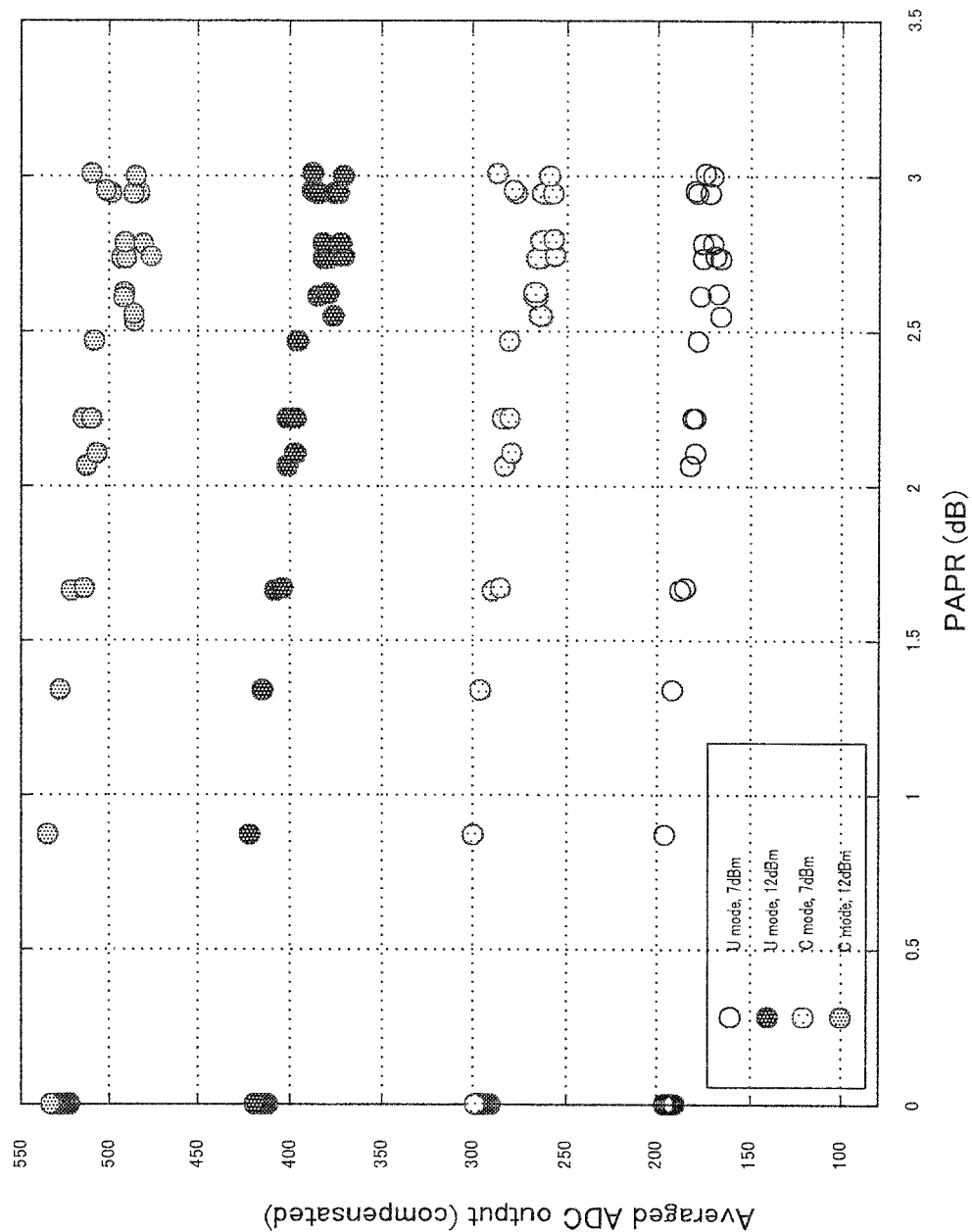

Further, FIG. 16 shows the relationships between the PAPR of the spread modulated signal and the average value of the ADC outputs after such compensation is carried out. As is clear from comparison with FIG. 11, if the mode is the same, virtually equal ADC output can be produced for the PAPR.

Figure 17:
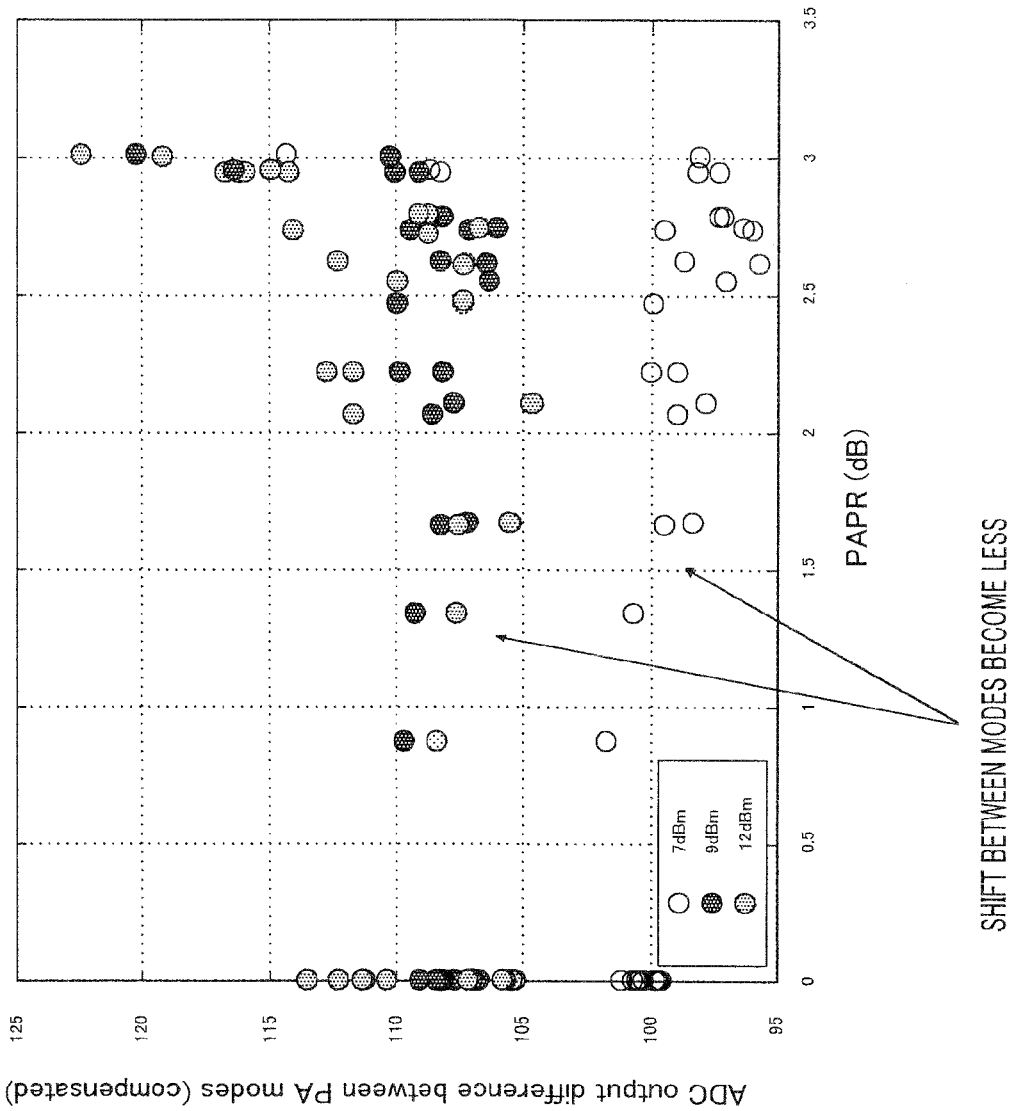
FIG. 17 illustrates the ADC output differences between β parameters after compensation.

Further, FIG. 17 shows relationships between the PAPR of spread modulated signal and the ADC output after such compensation is carried out. This figure shows that the ADC output differences between β parameters have decreased.

In practice, this compensation is carried out by multiplying the ADC output by a compensation value corresponding to the PAPR outputted from LUT1 and LUT2 in multiplier 135.

Next, compensation for the ADC output difference that is produced between modes will be described.

As shown in FIG. 10, even if the PA output is the same, the ADC output value varies between modes. Further, as shown in FIG. 11, even if the PAPR is the same, the ADC output value varies between modes. Further, a varying ADC output value means a varying detection result of the detector (output value) inputted to the ADC. That is, compensation for the ADC output value means compensation for the detection result of the detector.

Figure 18:
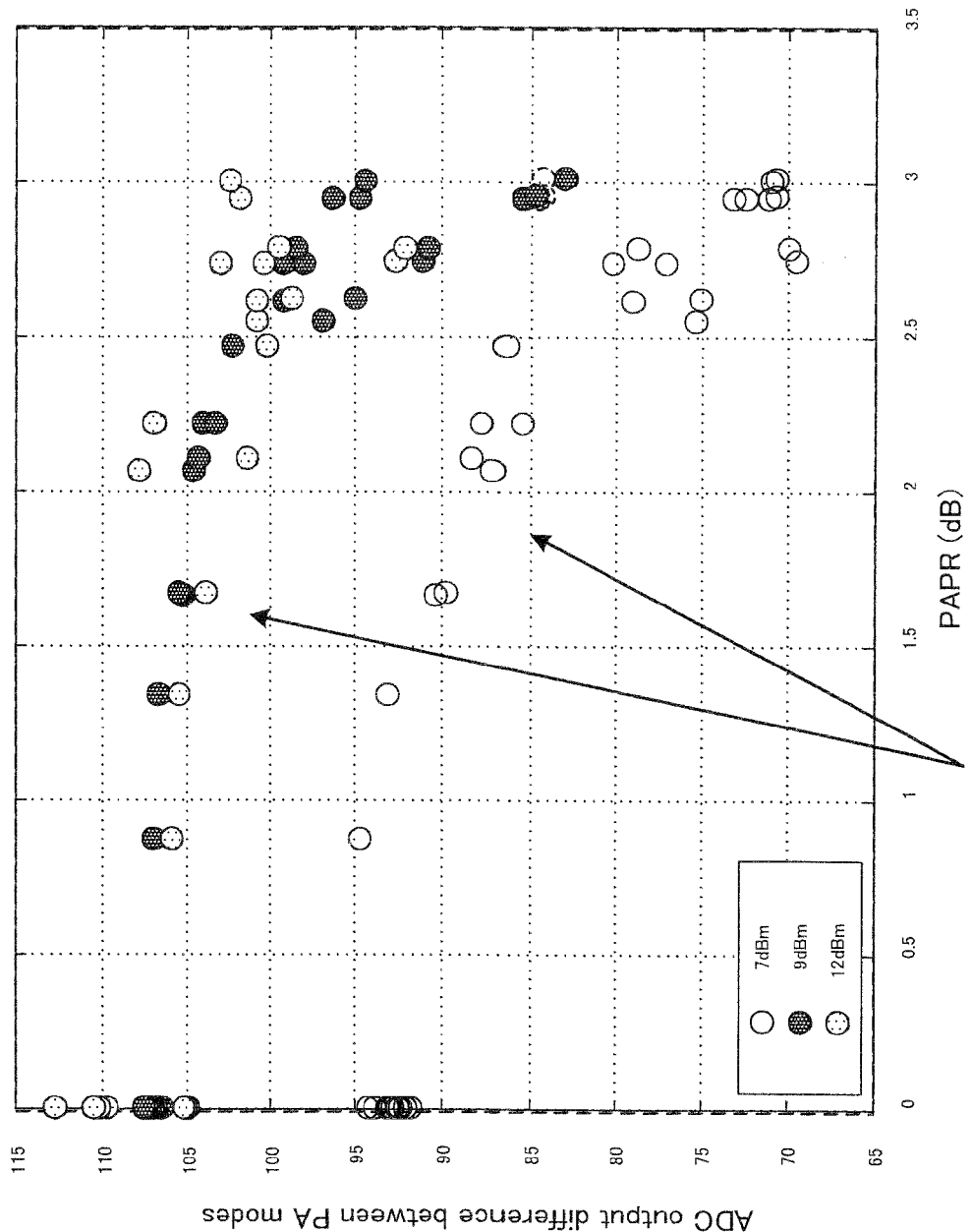
FIG. 18 shows the relationships between the PAPR and the ADC output differences between modes.

Then, the inventors have examined the relationships between the PAPR's and the ADC output differences between modes. FIG. 18 shows the result. In this figure, the circles for 7 dBm are plotted based on the ADC output difference between modes in a case where the PA output is kept at 7 dBm and the PAPR's of the spread modulated signals are changed (that is, the β parameter is changed). Similarly, the circles for 9 dBm are plotted based on the ADC output difference between modes in a case where the PA output is kept at 9 dBm and the PAPR's of the spread modulated signals are changed (that is, the β parameter is changed). The circles for 12 dBm are plotted in the same way.

Figure 19:
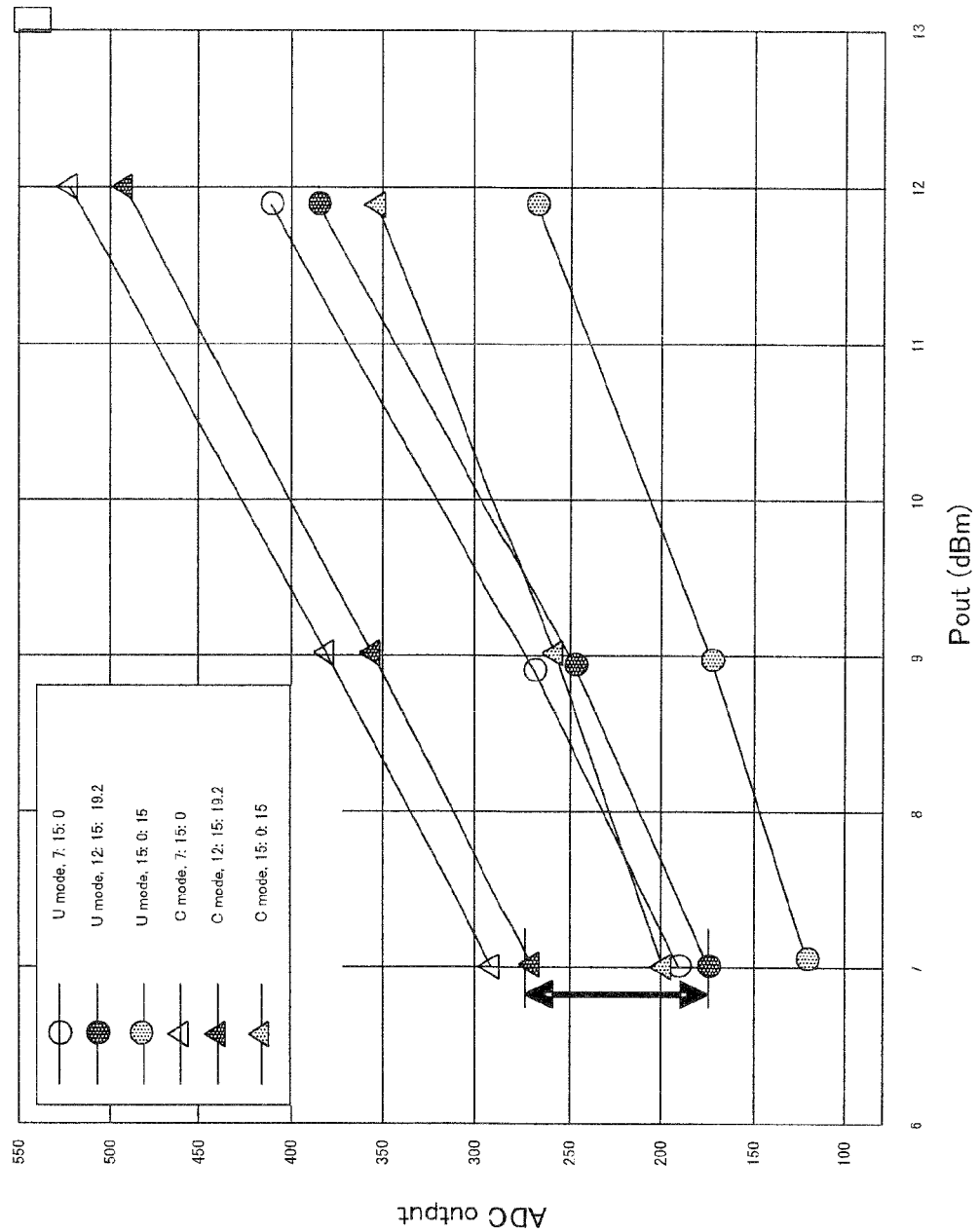
FIG. 19 illustrates compensation for the ADC output differences between modes.

The circles for 7 dBm in FIG. 18 are distributed in the vicinity of a certain curve. Similarly, the circles for 9 dBm are distributed in the vicinity of a certain curve, and the circles for 12 dBm are distributed in the vicinity of a certain curve. In view of these, if ADC outputs are compensated for in compressed mode (C mode) or uncompressed mode (U mode) such that the values of the curves on the vertical axis in FIG. 18 are constant according to the PAPR's, it is possible to make the ADC output difference between modes a constant value regardless of the PAPR, that is, regardless of the β parameter. FIG. 19 illustrates this compensation. If the ADC outputs in compressed mode (C mode) or uncompressed mode (U mode) are compensated for in the direction shown by an arrow of FIG. 19 according to the PAPR's, it is possible to make the ADC output difference between modes constant values.

This compensation is carried out in adder 136 by adding the compensation value corresponding to the PAPR outputted from LUT1 or LUT2 to the ADC output.

Next, the inventors have contemplated the device to further improve the accuracy in compensation. As examined in FIG. 12, between β parameters, there are combinations of β parameters in which the ADC output sensitivity varies even if the PAPR is the same, and, for example, a combination of the β parameter of 15:0:15 and the β parameter of 15:1:15 is one. As is clear from FIG. 12, even if the PAPR is 3 dBm, the ADC output sensitivity is 33 (1/dB) in a case where the β parameter is 15:0:15 and is 41 (1/dB) in a case where the β parameter is 15:1:15.

Figure 20:
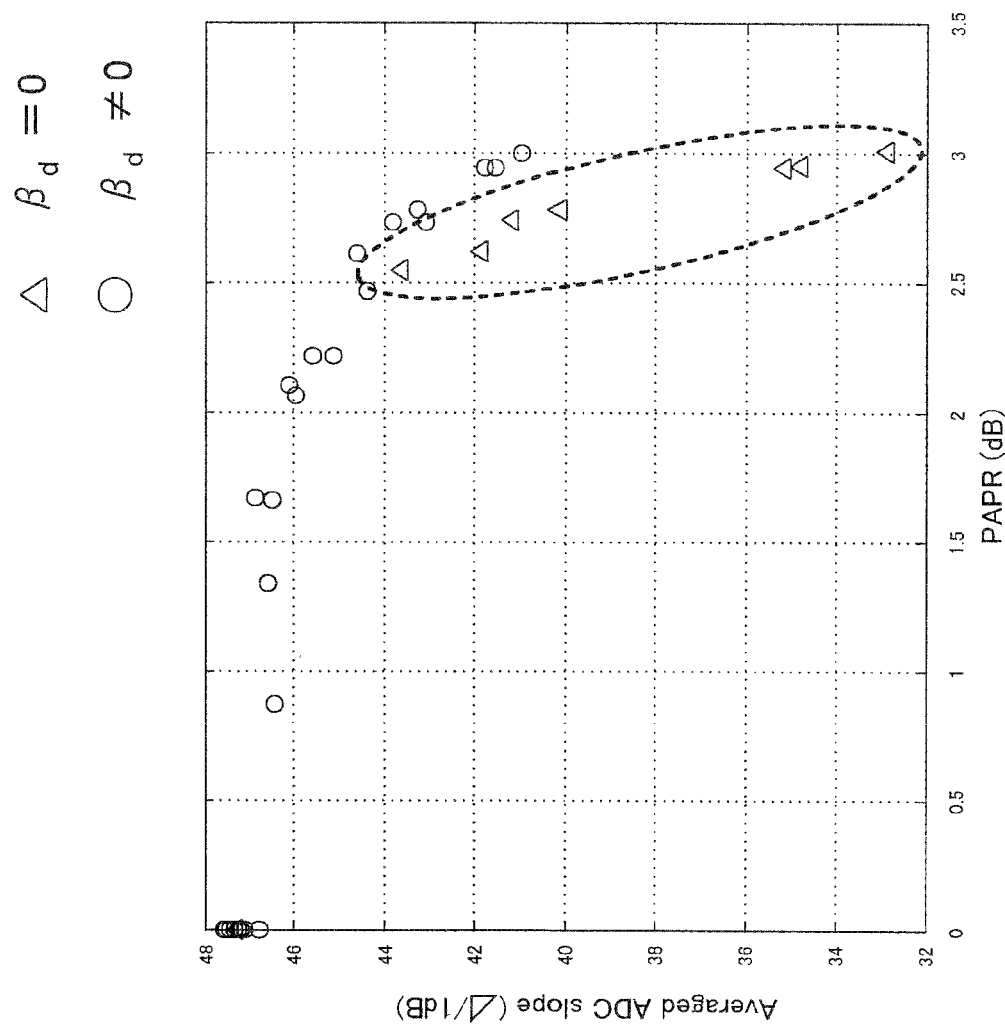
FIG. 20 shows that the relationships between the PAPR and the ADC sensitivity significantly varies in case $\beta d=0$ and in case $\beta d \neq 0$.

The inventors have found out that, as shown in FIG. 20, the relationships between the PAPR and the ADC sensitivity vary significantly between a case where the scale of a data channel signal is βd=0 and a case where the scale of a data channel signal is βd≠0 in β parameters. FIG. 20 shows that distinction can be made between the case of βd=0 and the case of βd≠0 in FIG. 12.

Figure 21:
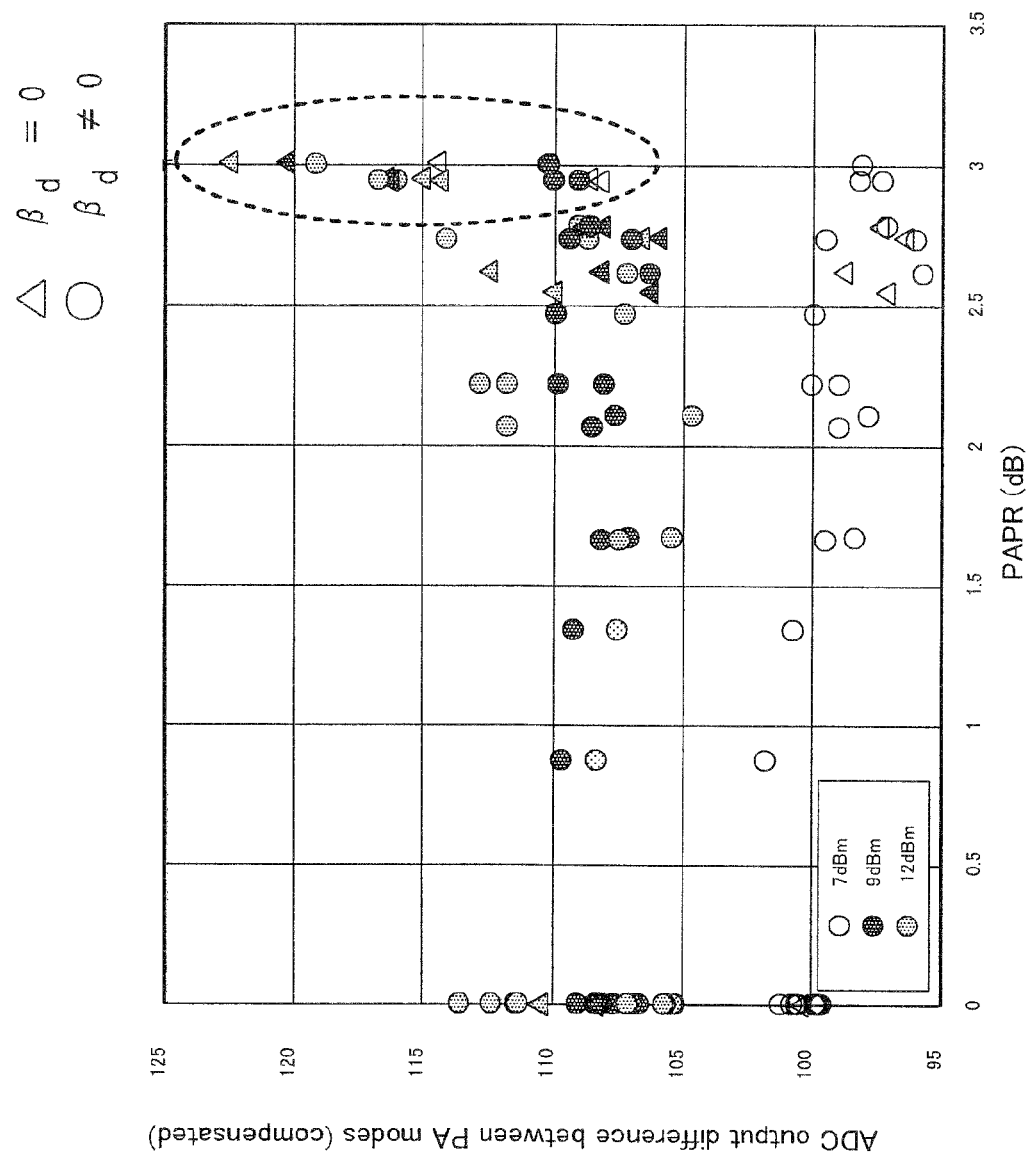
FIG. 21 shows that the relationships between the PAPR and the ADC output differences between modes significantly varies in case $\beta d=0$ and in case $\beta d \neq 0$.

Similarly, the inventors have found out that, as shown in FIG. 21, the relationships between the PAPR and the ADC output differences between modes vary significantly between a case where the scale of a data channel signal is βd=0 and a case where the scale of a data channel signal is βd≠0 in β parameters. FIG. 21 shows that distinction can be made between the case of βd=0 and the case of βd≠0 in FIG. 17.

In view of these, compensation for the ADC sensitivity (that is, compensation in multiplier 135) and compensation for the ADC output differences between modes (that is, compensation in adder 136) may be distinguished between βd=0 and βd≠0 and be carried out.

Polar modulation transmission apparatus 100 of the present embodiment detects whether βd=0 or βd≠0 by data channel detecting section 132, uses LUT1 in case βd=0 and uses LUT2 in case βd≠0. That is, LUT1 stores sensitivity compensation values and inter-mode compensation values for βd≠0, and LUT2 stores sensitivity compensation values and inter-mode compensation values for βd=0.

Consequently, as is clear from, for example, FIG. 20, to make the ADC sensitivity constant as much as possible, the ADC output is multiplied by a greater compensation coefficient in case βd=0 than in case βd≠0.

Figure 22:
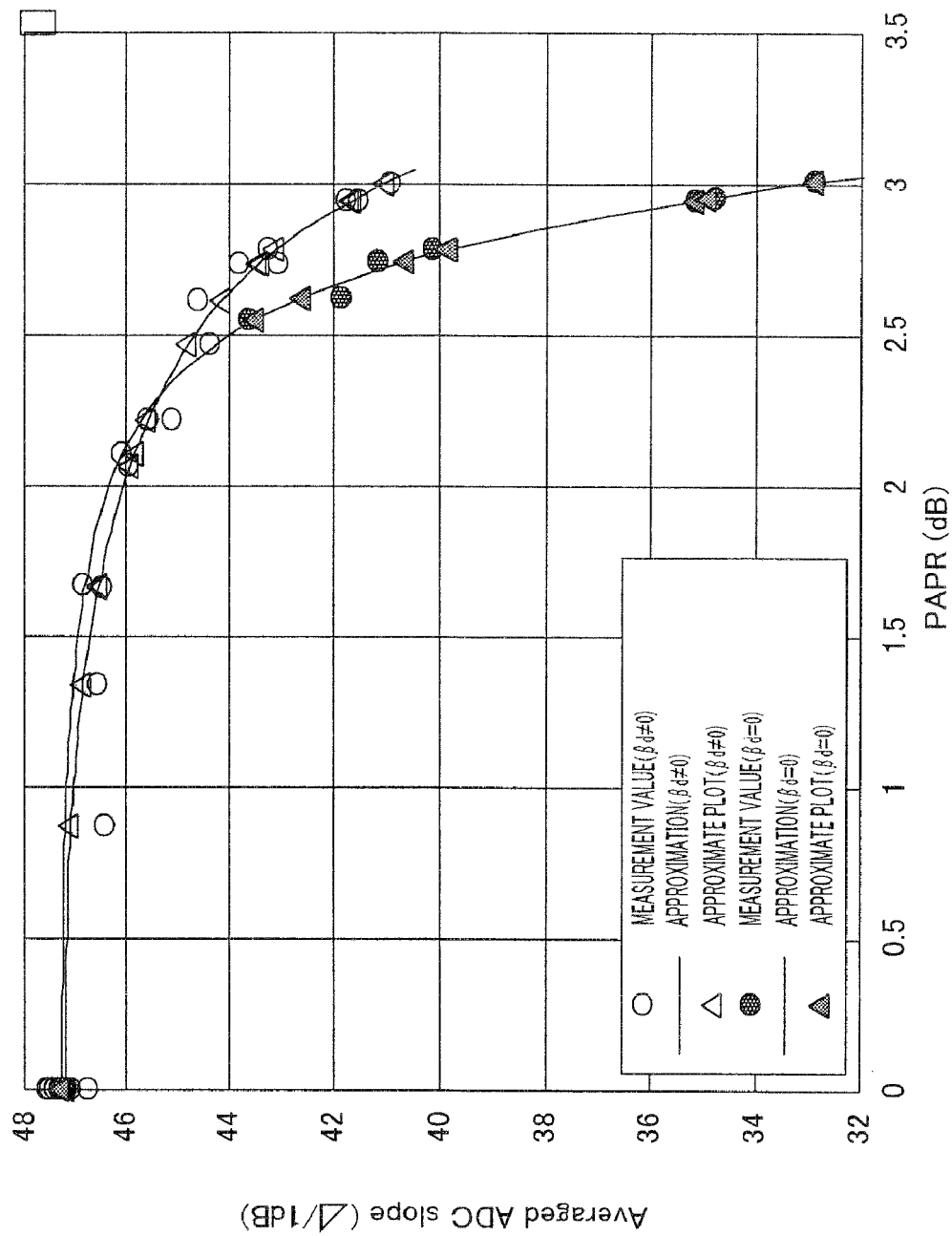
FIG. 22 shows an approximate curve for $\beta d=0$ and an approximate curve for $\beta d \neq 0$.

To find compensation values to be stored in compensation generating section 134, as shown in, for example, FIG. 22, an approximate curve in case βd=0 and an approximate curve in case βd≠0 are determined based on actual measurement values, and a multiplication coefficient for compensating for each curve may be determined per PAPR such that the ADC sensitivity becomes virtually constant even if the PAPR changes.

Figure 23:
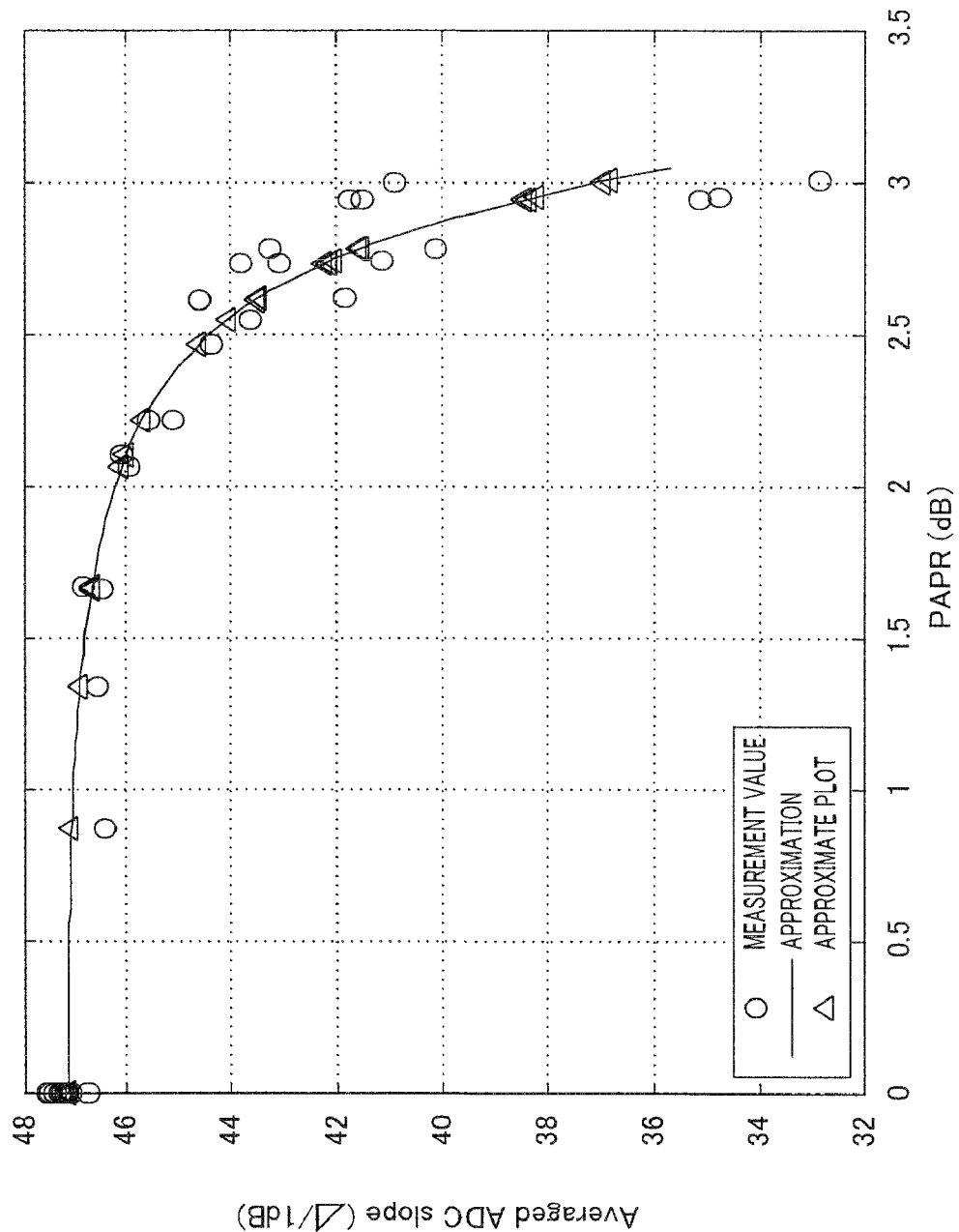
FIG. 23 shows an approximate curve of when no distinction is made between $\beta d=0$ and $\beta d \neq 0$.

Further, if no distinction is made between βd=0 and βd≠0, as shown in, for example, FIG. 23, one approximate curve is determined, and a multiplication coefficient for compensating for one curve may be determined per PAPR such that the ADC sensitivity becomes constant even if the PAPR changes.

Table 1 to table 4 show examples of compensation coefficients for compensating for the ADC sensitivity (measurement sensitivity) per PAPR to be stored in compensation value generating section 134.

Table 1 shows the inclinations under β parameters determined based on actual measurement values and compensation coefficients in cases where the β parameters are ideally estimated based on the PAPR's.

Table 2-1 to table 2-6 show cases where one approximate curve is determined based on actual measurement values as in FIG. 23 and compensation coefficients for all β parameters are determined using this curve. That is, examples of compensation coefficients are shown in cases where compensation is performed separately depending on whether or not there is data channel signal β.

Table 3-1 to table 3-6 show cases where approximate curves are determined separately in case βd=0 and in case βd≠0 based on actual measurement values as in FIG. 22, and, in these approximate curves, compensation coefficients are determined using the approximate curve in case βd≠0.

Table 4 shows cases where approximate curves are determined separately in case βd=0 and in case βd≠0 based on actual measurement values as in FIG. 22, and, in these approximate curves, compensation coefficients are determined using the approximate curve in case βd=0.

As described above, the present embodiment provides PAPR calculating section 131 that calculates the PAPR of the spread modulated signal, compensation value generating section 134 that outputs a compensation value corresponding to the calculated PAPR and multiplier 135 that multiplies a detection result obtained by detector 106 by the compensation value, so that it is possible to compensate for the ADC sensitivity (measurement sensitivity) which changes following the variation of the β parameter and make the sensitivity of the detector (measurement sensitivity) virtually constant. As a result, the amount of shift between modes can be made constant regardless of the β parameter and the accuracy of power measurement improves, so that it is possible to realize accurate transmission power control.

Further, PAPR calculating section 131 that calculates the PAPR of the spread modulated signal, compensation value generating section 134 that outputs a compensation value corresponding to the calculated PAPR and adder 136 that adds the compensation value to the detection result obtained by detector 106 are provided, so that it is possible to reduce the measurement value differences between compressed mode and uncompressed mode. As a result, it is possible to realize more accurate transmission power control.

Further, compensation for the ADC sensitivity and compensation for the ADC output differences between modes are carried out using compensation values that are distinguished between βd=0 and βd≠0, so that it is possible to compensate for the ADC sensitivity and compensate for the ADC output differences between modes more accurately.

(5) Other Embodiments

Although a configuration has been described with the above embodiment where the ADC sensitivity (measurement sensitivity) that changes following the variation of the β parameter and the measurement value differences between modes both can be compensated for by including both a multiplier and an adder as arithmetic operation sections in a power measurement error compensating section, a configuration is also possible where only one of ADC sensitivity and measurement error can be compensated for. That is, a configuration may be possible where only a multiplier is provided or only an adder is provided as an arithmetic operation section. In such a case, there is an advantage of simplifying the configuration.

Figure 24:
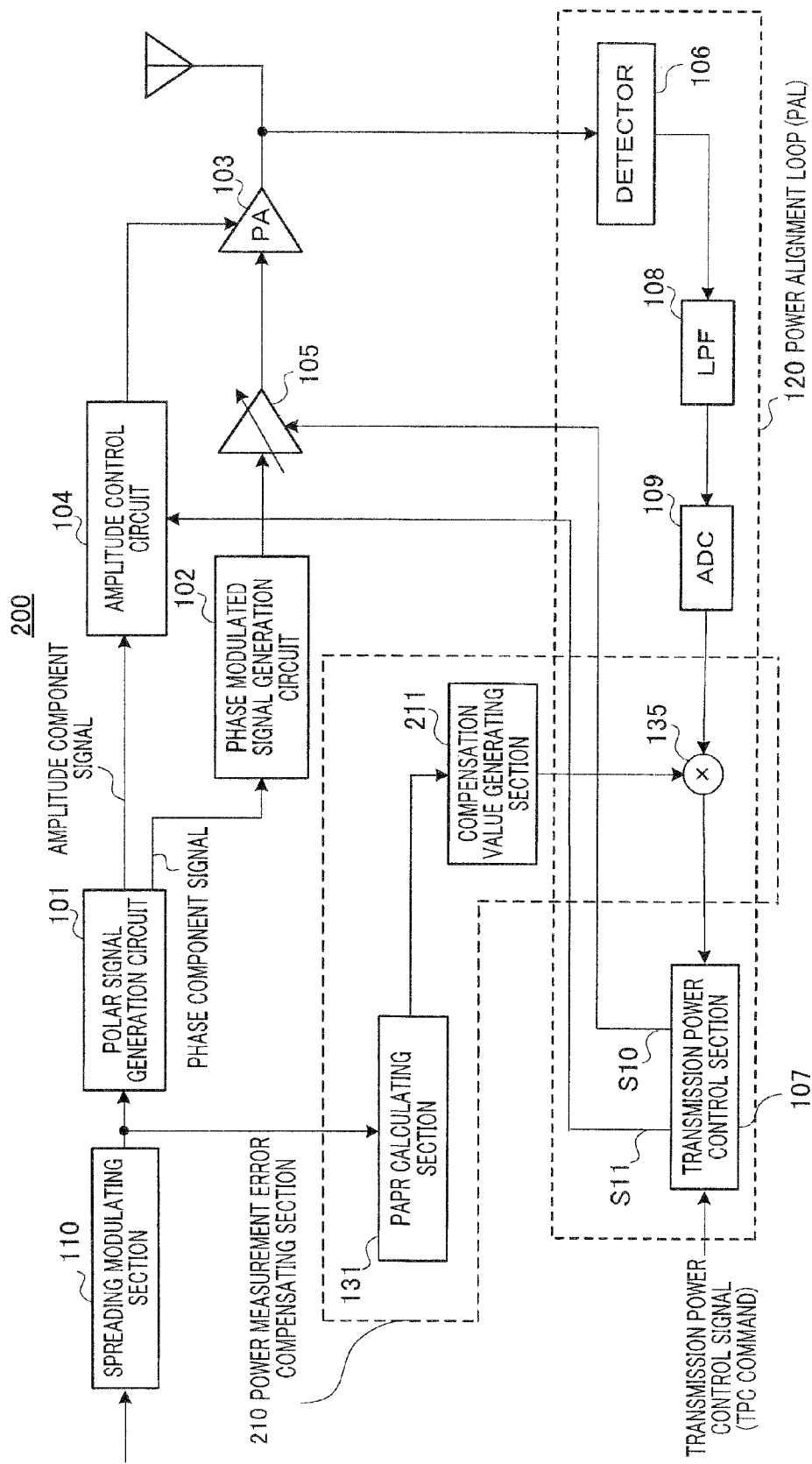
FIG. 24 is a block diagram showing a configuration example of the polar modulation transmission apparatus according to another embodiment.
Figure 25:
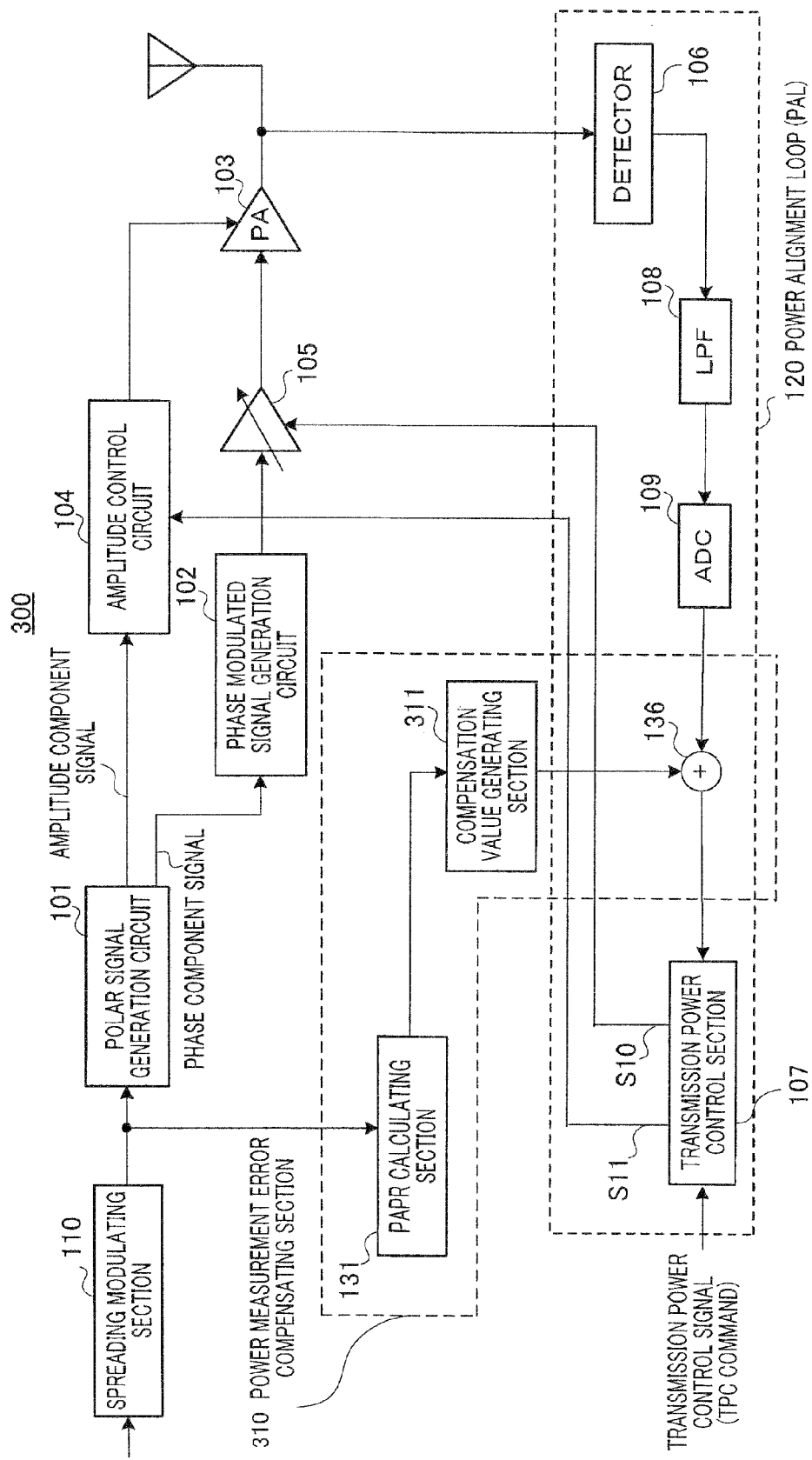
FIG. 25 is a block diagram showing a configuration example of the polar modulation transmission apparatus according to another embodiment.
Figure 26:
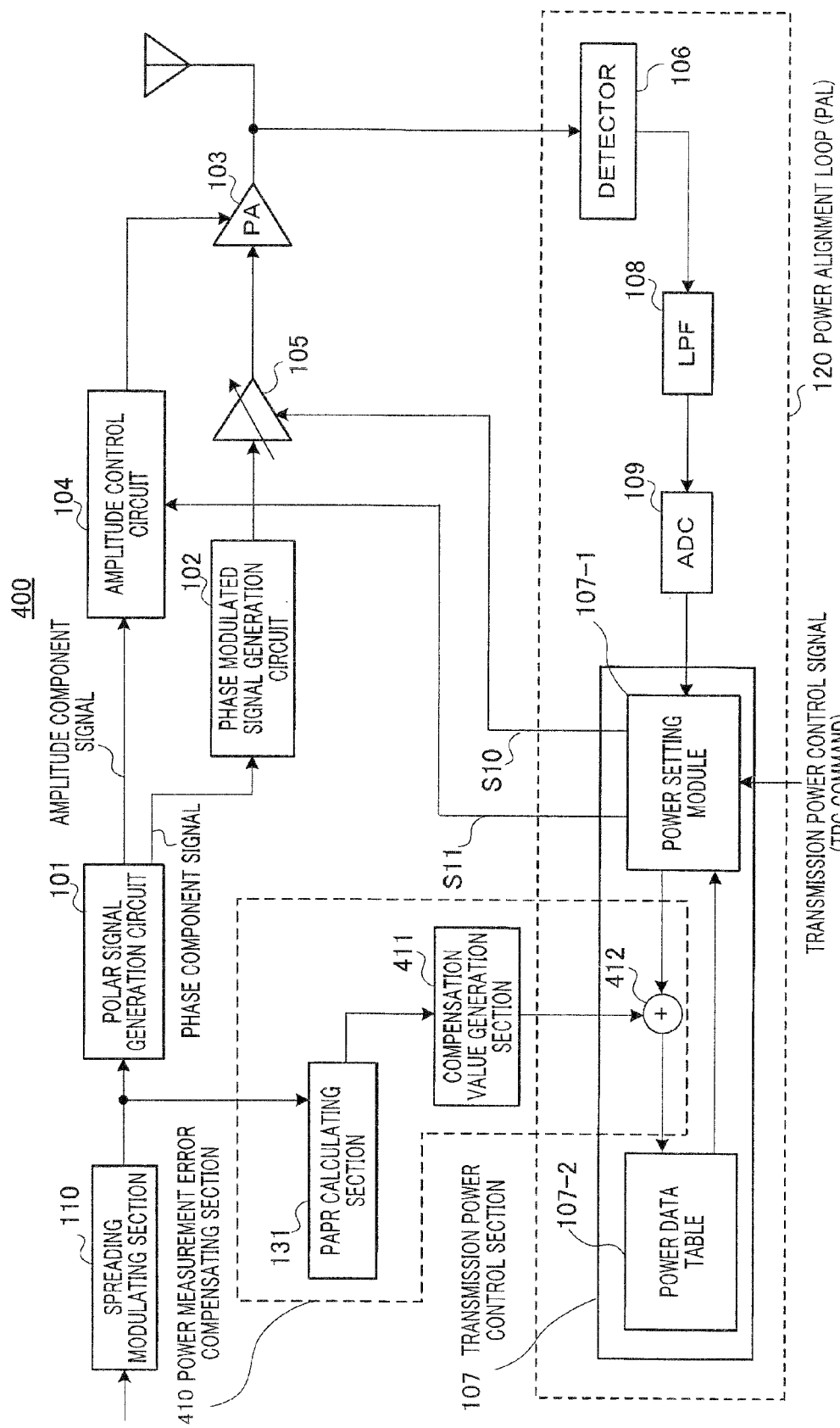
FIG. 26 is a block diagram showing a configuration example of the polar modulation transmission apparatus according to another embodiment.

FIG. 24 shows a configuration example of compensating for the ADC sensitivity (measurement sensitivity) that changes following the variation of β parameter. FIG. 25 and FIG. 26 show configuration examples of compensating for the measurement value differences between modes. Further, FIG. 24, FIG. 25 and FIG. 26 show configurations where compensation is performed separately depending on whether or not there is data channel signal βd.

In FIG. 24, the components corresponding to components in FIG. 6 are assigned the same reference numerals, and polar modulation transmission apparatus 200 has power measurement error compensating section 210. Compensation value generating section (lookup table) 211 in power measurement error compensating section 210 stores an ADC sensitivity (measurement sensitivity) compensation value per PAPR and outputs a compensation value corresponding to the PAPR from PAPR calculating section 131. By this means, in multiplier 135, even if the β parameter changes in spreading modulating section 110, a measurement value showing that the ADC sensitivity (measurement sensitivity) is virtually constant, is outputted.

In FIG. 25, the components corresponding to components of FIG. 6 are assigned the same reference numerals and polar modulation transmission apparatus 300 has power measurement error compensating section 310. Compensation value generating section (lookup table) 311 in power measurement error compensating section 310 stores a compensation value per PAPR for compensating for the measurement value differences between modes and outputs a compensation value corresponding to the PAPR from PAPR calculating section 131. By this means, adder 136 outputs a measurement value in which the measurement value differences between modes are reduced.

FIG. 26 shows another configuration example for compensating for the measurement value differences between modes. Transmission power control section 107 has power setting module 107-1, power table 107-2 and adder 412. Instead of compensating for the output of ADC 109, power measurement error compensating section 410 of polar modulation transmission apparatus 400 compensates for the read address of when a power setting value is read from a power data table by power setting module 107-1 in transmission power control section 107. To be more specific, compensation value generating section 411 stores an address compensation value per PAPR in compensation value generating section 411. The address compensation value outputted from compensation value generating section 411 is added by adder 412 to the read address outputted from power setting module 107-1. By this means, a power setting value which takes into account the measurement value differences between modes is outputted from power data table 107-2 to power setting module 107-1. Further, although adder 412 is used with the above configuration, it is obvious that the above described multiplier may be used instead of adder 412.

Figure 27:
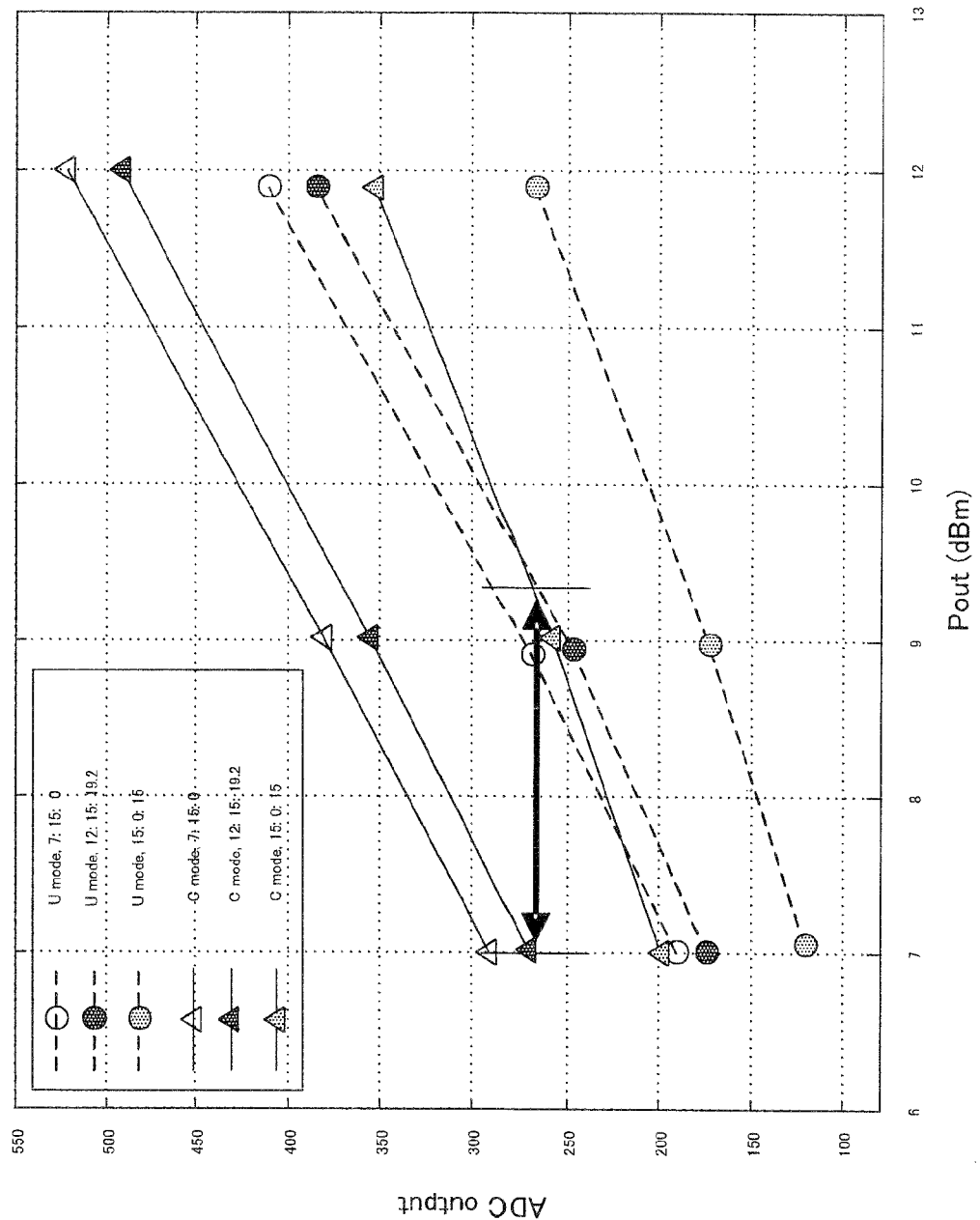
FIG. 27 illustrates compensation for the ADC output differences between modes when the configuration of FIG. 26 is used.

FIG. 27 illustrates such compensation. When the same power is set between modes in power setting module 107-1, a power setting value outputted from power data table 107-2 may be changed in the direction shown by an arrow in FIG. 27 by compensating for the read address such that ADC output values are the same.

TABLE 1

| βc/βd | βhs/βc | PAPR | INCLINATION | CONPENSATION COEFFICIENT |
|---|---|---|---|---|
| 3 | 15 | 0 | 15 | 0 | 47.5495 | 1 |
| 7 | 15 | 0 | 15 | 0 | 47.5232 | 1.0006 |
| 8 | 15 | 0 | 15 | 0 | 47.2298 | 1.0068 |
| 8 | 15 | 8 | 15 | 0.8715 | 46.4467 | 1.0237 |
| 8 | 15 | 15 | 15 | 1.3437 | 46.5525 | 1.0214 |
| 8 | 15 | 30 | 15 | 1.6724 | 46.8603 | 1.0147 |
| 12 | 15 | 0 | 15 | 0 | 47.1926 | 1.0076 |
| 12 | 15 | 24 | 15 | 2.1077 | 46.1019 | 1.0314 |
| 12 | 15 | 30 | 15 | 2.067 | 45.9475 | 1.0349 |
| 15 | 15 | 0 | 15 | 0 | 46.7584 | 1.0169 |
| 15 | 15 | 8 | 15 | 1.6641 | 46.4635 | 1.0234 |
| 15 | 15 | 15 | 15 | 2.2185 | 45.1151 | 1.054 |
| 15 | 15 | 30 | 15 | 2.2185 | 45.5851 | 1.0431 |
| 15 | 12 | 0 | 15 | 0 | 47.4118 | 1.0029 |
| 15 | 8 | 0 | 15 | 0 | 47.073 | 1.0101 |
| 15 | 8 | 19 | 15 | 2.7345 | 43.0778 | 1.1038 |
| 15 | 7 | 0 | 15 | 0 | 47.2297 | 1.0068 |
| 15 | 7 | 30 | 15 | 2.4714 | 44.3647 | 1.0718 |
| 15 | 1 | 0 | 15 | 0 | 47.3281 | 1.0047 |
| 15 | 1 | 8 | 15 | 2.6188 | 44.5997 | 1.0661 |
| 15 | 1 | 9 | 15 | 2.7404 | 43.797 | 1.0857 |
| 15 | 1 | 12 | 15 | 2.9512 | 41.5083 | 1.1455 |

TABLE 1-continued

| βc/βd | βhs/βc | PAPR | INCLINATION | CONPENSATION COEFFICIENT |
|---|---|---|---|---|
| 15 | 1 | 15 | 15 | 3.0055 | 40.9097 | 1.1623 |
| 15 | 1 | 19 | 15 | 2.947 | 41.7496 | 1.1389 |
| 15 | 1 | 24 | 15 | 2.7824 | 43.2555 | 1.0993 |
| 15 | 0 | 0 | 15 | 0 | 47.2872 | 1.0055 |
| 15 | 0 | 8 | 15 | 2.6256 | 41.8583 | 1.136 |
| 15 | 0 | 9 | 15 | 2.747 | 41.1686 | 1.155 |
| 15 | 0 | 12 | 15 | 2.957 | 34.7762 | 1.3673 |
| 15 | 0 | 15 | 15 | 3.0103 | 32.8604 | 1.447 |
| 15 | 0 | 19 | 15 | 2.9506 | 35.1453 | 1.3529 |
| 15 | 0 | 24 | 15 | 2.785 | 40.1039 | 1.1857 |
| 15 | 0 | 30 | 15 | 2.5527 | 43.6076 | 1.0904 |

TABLE 2-1

| βc/βd | βhs/βc | PAPR | INCLINATION | CONPENSATION COEFFICIENT |
|---|---|---|---|---|
| 0 | 15 | 0 | 15 | 0 | 47.1314 | 1 |
| 1 | 15 | 0 | 15 | 0 | 47.1314 | 1 |
| 1 | 15 | 5 | 15 | 0.0128 | 47.1314 | 1 |
| 1 | 15 | 6 | 15 | 0.0153 | 47.1314 | 1 |
| 1 | 15 | 8 | 15 | 0.0204 | 47.1314 | 1 |
| 1 | 15 | 9 | 15 | 0.023 | 47.1314 | 1 |
| 1 | 15 | 12 | 15 | 0.0306 | 47.1314 | 1 |
| 1 | 15 | 15 | 15 | 0.0381 | 47.1314 | 1 |
| 1 | 15 | 19 | 15 | 0.0481 | 47.1314 | 1 |
| 1 | 15 | 24 | 15 | 0.0604 | 47.1314 | 1 |
| 1 | 15 | 30 | 15 | 0.0749 | 47.1314 | 1 |
| 2 | 15 | 0 | 15 | 0 | 47.1314 | 1 |
| 2 | 15 | 5 | 15 | 0.0502 | 47.1314 | 1 |
| 2 | 15 | 6 | 15 | 0.0601 | 47.1314 | 1 |
| 2 | 15 | 8 | 15 | 0.0798 | 47.1314 | 1 |
| 2 | 15 | 9 | 15 | 0.0895 | 47.1313 | 1 |
| 2 | 15 | 12 | 15 | 0.1184 | 47.1312 | 1 |
| 2 | 15 | 15 | 15 | 0.1466 | 47.1311 | 1 |
| 2 | 15 | 19 | 15 | 0.183 | 47.1308 | 1 |
| 2 | 15 | 24 | 15 | 0.2264 | 47.1303 | 1 |
| 2 | 15 | 30 | 15 | 0.2747 | 47.1294 | 1 |
| 3 | 15 | 0 | 15 | 0 | 47.1314 | 1 |
| 3 | 15 | 5 | 15 | 0.1095 | 47.1313 | 1 |
| 3 | 15 | 6 | 15 | 0.1308 | 47.1312 | 1 |
| 3 | 15 | 8 | 15 | 0.1728 | 47.1309 | 1 |
| 3 | 15 | 9 | 15 | 0.1933 | 47.1307 | 1 |
| 3 | 15 | 12 | 15 | 0.2533 | 47.1298 | 1 |
| 3 | 15 | 15 | 15 | 0.3103 | 47.1285 | 1.0001 |
| 3 | 15 | 19 | 15 | 0.3813 | 47.126 | 1.0001 |
| 3 | 15 | 24 | 15 | 0.4612 | 47.1218 | 1.0002 |
| 3 | 15 | 30 | 15 | 0.5436 | 47.1157 | 1.0003 |
| 4 | 15 | 0 | 15 | 0 | 47.1314 | 1 |
| 4 | 15 | 5 | 15 | 0.1867 | 47.1308 | 1 |
| 4 | 15 | 6 | 15 | 0.2224 | 47.1303 | 1 |
| 4 | 15 | 8 | 15 | 0.2918 | 47.129 | 1.0001 |
| 4 | 15 | 9 | 15 | 0.3254 | 47.128 | 1.0001 |
| 4 | 15 | 12 | 15 | 0.4214 | 47.1241 | 1.0002 |
| 4 | 15 | 15 | 15 | 0.5096 | 47.1184 | 1.0003 |
| 4 | 15 | 19 | 15 | 0.6145 | 47.1087 | 1.0005 |
| 4 | 15 | 24 | 15 | 0.7247 | 47.0941 | 1.0008 |
| 4 | 15 | 30 | 15 | 0.8273 | 47.0759 | 1.0012 |
| 5 | 15 | 0 | 15 | 0 | 47.1314 | 1 |
| 5 | 15 | 5 | 15 | 0.2773 | 47.1293 | 1 |
| 5 | 15 | 6 | 15 | 0.3292 | 47.1279 | 1.0001 |
| 5 | 15 | 8 | 15 | 0.4286 | 47.1237 | 1.0002 |
| 5 | 15 | 9 | 15 | 0.476 | 47.1208 | 1.0002 |
| 5 | 15 | 12 | 15 | 0.6084 | 47.1094 | 1.0005 |
| 5 | 15 | 15 | 15 | 0.7255 | 47.094 | 1.0008 |
| 5 | 15 | 19 | 15 | 0.8576 | 47.0696 | 1.0013 |
| 5 | 15 | 24 | 15 | 0.9857 | 47.0375 | 1.002 |
| 5 | 15 | 30 | 15 | 1.0914 | 47.0038 | 1.0027 |
| 6 | 15 | 0 | 15 | 0 | 47.1314 | 1 |

TABLE 2-2

| | | | | | | |
|---|---|---|---|---|---|---|
| 6 | 15 | 5 | 15 | 0.3765 | 47.1262 | 1.0001 |
| 6 | 15 | 6 | 15 | 0.4452 | 47.1228 | 1.0002 |
| 6 | 15 | 8 | 15 | 0.575 | 47.1128 | 1.0004 |
| 6 | 15 | 9 | 15 | 0.6359 | 47.1062 | 1.0005 |
| 6 | 15 | 12 | 15 | 0.8019 | 47.0809 | 1.0011 |
| 6 | 15 | 15 | 15 | 0.9427 | 47.0493 | 1.0017 |
| 6 | 15 | 19 | 15 | 1.0928 | 47.0033 | 1.0027 |
| 6 | 15 | 24 | 15 | 1.2261 | 46.9499 | 1.0039 |
| 6 | 15 | 30 | 15 | 1.3212 | 46.9035 | 1.0049 |
| 7 | 15 | 0 | 15 | 0 | 47.1314 | 1 |
| 7 | 15 | 5 | 15 | 0.4801 | 47.1206 | 1.0002 |
| 7 | 15 | 6 | 15 | 0.5656 | 47.1137 | 1.0004 |
| 7 | 15 | 8 | 15 | 0.7244 | 47.0942 | 1.0008 |
| 7 | 15 | 9 | 15 | 0.7977 | 47.0817 | 1.0011 |
| 7 | 15 | 12 | 15 | 0.9925 | 47.0355 | 1.002 |
| 7 | 15 | 15 | 15 | 1.1508 | 46.9816 | 1.0032 |
| 7 | 15 | 19 | 15 | 1.3099 | 46.9094 | 1.0047 |
| 7 | 15 | 24 | 15 | 1.4381 | 46.8354 | 1.0063 |
| 7 | 15 | 30 | 15 | 1.5138 | 46.7838 | 1.0074 |
| 8 | 15 | 0 | 15 | 0 | 47.1314 | 1 |
| 8 | 15 | 5 | 15 | 0.5846 | 47.1118 | 1.0004 |
| 8 | 15 | 6 | 15 | 0.6859 | 47.0998 | 1.0007 |
| 8 | 15 | 8 | 15 | 0.8715 | 47.0665 | 1.0014 |
| 8 | 15 | 9 | 15 | 0.9556 | 47.0459 | 1.0018 |
| 8 | 15 | 12 | 15 | 1.1738 | 46.9724 | 1.0034 |
| 8 | 15 | 15 | 15 | 1.3437 | 46.8914 | 1.0051 |
| 8 | 15 | 19 | 15 | 1.5043 | 46.7906 | 1.0073 |
| 8 | 15 | 24 | 15 | 1.6204 | 46.6991 | 1.0093 |
| 8 | 15 | 30 | 15 | 1.6724 | 46.652 | 1.0103 |
| 9 | 15 | 0 | 15 | 0 | 47.1314 | 1 |
| 9 | 15 | 5 | 15 | 0.6872 | 47.0996 | 1.0007 |
| 9 | 15 | 6 | 15 | 0.8032 | 47.0806 | 1.0011 |
| 9 | 15 | 8 | 15 | 1.0126 | 47.0296 | 1.0022 |
| 9 | 15 | 9 | 15 | 1.1059 | 46.9986 | 1.0028 |
| 9 | 15 | 12 | 15 | 1.3423 | 46.8921 | 1.0051 |
| 9 | 15 | 15 | 15 | 1.5186 | 46.7802 | 1.0075 |
| 9 | 15 | 19 | 15 | 1.6752 | 46.6493 | 1.0103 |
| 9 | 15 | 24 | 15 | 1.7751 | 46.5449 | 1.0126 |
| 9 | 15 | 30 | 15 | 1.8021 | 46.5132 | 1.0133 |
| 10 | 15 | 0 | 15 | 0 | 47.1314 | 1 |
| 10 | 15 | 5 | 15 | 0.7858 | 47.0839 | 1.001 |
| 10 | 15 | 6 | 15 | 0.9153 | 47.0563 | 1.0016 |
| 10 | 15 | 8 | 15 | 1.1454 | 46.9837 | 1.0031 |
| 10 | 15 | 9 | 15 | 1.2464 | 46.9406 | 1.0041 |
| 10 | 15 | 12 | 15 | 1.4962 | 46.7963 | 1.0072 |
| 10 | 15 | 15 | 15 | 1.6749 | 46.6495 | 1.0103 |
| 10 | 15 | 19 | 15 | 1.8237 | 46.4866 | 1.0139 |
| 10 | 15 | 24 | 15 | 1.9055 | 46.3752 | 1.0163 |
| 10 | 15 | 30 | 15 | 1.9081 | 46.3712 | 1.0164 |
| 11 | 15 | 0 | 15 | 0 | 47.1314 | 1 |
| 11 | 15 | 5 | 15 | 0.8793 | 47.0648 | 1.0014 |
| 11 | 15 | 6 | 15 | 1.0207 | 47.0271 | 1.0022 |
| 11 | 15 | 8 | 15 | 1.2687 | 46.93 | 1.0043 |
| 11 | 15 | 9 | 15 | 1.3758 | 46.8733 | 1.0055 |
| 11 | 15 | 12 | 15 | 1.6352 | 46.6861 | 1.0095 |
| 11 | 15 | 15 | 15 | 1.8133 | 46.4996 | 1.0136 |

TABLE 2-3

| | | | | | | |
|---|---|---|---|---|---|---|
| 11 | 15 | 19 | 15 | 1.9521 | 46.3027 | 1.0179 |
| 11 | 15 | 24 | 15 | 2.0152 | 46.1922 | 1.0203 |
| 11 | 15 | 30 | 15 | 1.9952 | 46.229 | 1.0195 |
| 12 | 15 | 0 | 15 | 0 | 47.1314 | 1 |
| 12 | 15 | 5 | 15 | 0.9668 | 47.0428 | 1.0019 |
| 12 | 15 | 6 | 15 | 1.1188 | 46.9938 | 1.0029 |
| 12 | 15 | 8 | 15 | 1.382 | 46.8697 | 1.0056 |
| 12 | 15 | 9 | 15 | 1.4941 | 46.7978 | 1.0071 |
| 12 | 15 | 12 | 15 | 1.7598 | 46.5621 | 1.0122 |
| 12 | 15 | 15 | 15 | 1.9352 | 46.3299 | 1.0173 |
| 12 | 15 | 19 | 15 | 2.0628 | 46.0981 | 1.0224 |
| 12 | 15 | 24 | 15 | 2.1077 | 45.9989 | 1.0246 |
| 12 | 15 | 30 | 15 | 2.067 | 46.0892 | 1.0226 |
| 13 | 15 | 0 | 15 | 0 | 47.1314 | 1 |
| 13 | 15 | 5 | 15 | 1.0481 | 47.0184 | 1.0024 |
| 13 | 15 | 6 | 15 | 1.2094 | 46.9573 | 1.0037 |
| 13 | 15 | 8 | 15 | 1.4853 | 46.8039 | 1.007 |
| 13 | 15 | 9 | 15 | 1.6013 | 46.7154 | 1.0089 |

TABLE 2-3-continued

| | | | | | | |
|---|---|---|---|---|---|---|
| 13 | 15 | 12 | 15 | 1.8709 | 46.4245 | 1.0152 |
| 13 | 15 | 15 | 15 | 2.0422 | 46.1401 | 1.0215 |
| 13 | 15 | 19 | 15 | 2.1581 | 45.874 | 1.0274 |
| 13 | 15 | 24 | 15 | 2.1859 | 45.7983 | 1.0291 |
| 13 | 15 | 30 | 15 | 2.1266 | 45.9539 | 1.0256 |
| 14 | 15 | 0 | 15 | 0 | 47.1314 | 1 |
| 14 | 15 | 5 | 15 | 1.1231 | 46.9923 | 1.003 |
| 14 | 15 | 6 | 15 | 1.2925 | 46.9183 | 1.0045 |
| 14 | 15 | 8 | 15 | 1.5792 | 46.7337 | 1.0085 |
| 14 | 15 | 9 | 15 | 1.6981 | 46.6269 | 1.0108 |
| 14 | 15 | 12 | 15 | 1.9698 | 46.2733 | 1.0185 |
| 14 | 15 | 15 | 15 | 2.1361 | 45.9306 | 1.0261 |
| 14 | 15 | 19 | 15 | 2.2405 | 45.6331 | 1.0328 |
| 14 | 15 | 24 | 15 | 2.2523 | 45.5941 | 1.0337 |
| 14 | 15 | 30 | 15 | 2.1765 | 45.8246 | 1.0285 |
| 15 | 15 | 0 | 15 | 0 | 47.1314 | 1 |
| 15 | 15 | 5 | 15 | 1.1919 | 46.9648 | 1.0035 |
| 15 | 15 | 6 | 15 | 1.3684 | 46.8776 | 1.0054 |
| 15 | 15 | 8 | 15 | 1.6641 | 46.6598 | 1.0101 |
| 15 | 15 | 9 | 15 | 1.7854 | 46.533 | 1.0129 |
| 15 | 15 | 12 | 15 | 2.0576 | 46.1088 | 1.0222 |
| 15 | 15 | 15 | 15 | 2.2185 | 45.7025 | 1.0313 |
| 15 | 15 | 19 | 15 | 2.3117 | 45.3788 | 1.0386 |
| 15 | 15 | 24 | 15 | 2.309 | 45.3896 | 1.0384 |
| 15 | 15 | 30 | 15 | 2.2185 | 45.7025 | 1.0313 |
| 15 | 14 | 0 | 15 | 0 | 47.1314 | 1 |
| 15 | 14 | 5 | 15 | 1.2591 | 46.9346 | 1.0042 |
| 15 | 14 | 6 | 15 | 1.4422 | 46.8327 | 1.0064 |
| 15 | 14 | 8 | 15 | 1.746 | 46.5773 | 1.0119 |
| 15 | 14 | 9 | 15 | 1.8691 | 46.427 | 1.0152 |
| 15 | 14 | 12 | 15 | 2.1409 | 45.9184 | 1.0264 |
| 15 | 14 | 15 | 15 | 2.2958 | 45.4399 | 1.0372 |
| 15 | 14 | 19 | 15 | 2.3777 | 45.0959 | 1.0451 |
| 15 | 14 | 24 | 15 | 2.3608 | 45.1735 | 1.0433 |
| 15 | 14 | 30 | 15 | 2.2565 | 45.5801 | 1.034 |
| 15 | 13 | 0 | 15 | 0 | 47.1314 | 1 |
| 15 | 13 | 5 | 15 | 1.329 | 46.8993 | 1.0049 |
| 15 | 13 | 6 | 15 | 1.5186 | 46.7802 | 1.0075 |

TABLE 2-4

| | | | | | | |
|---|---|---|---|---|---|---|
| 15 | 13 | 8 | 15 | 1.8299 | 46.4788 | 1.014 |
| 15 | 13 | 9 | 15 | 1.9546 | 46.2986 | 1.018 |
| 15 | 13 | 12 | 15 | 2.2249 | 45.6825 | 1.0317 |
| 15 | 13 | 15 | 15 | 2.3729 | 45.1184 | 1.0446 |
| 15 | 13 | 19 | 15 | 2.4427 | 44.7625 | 1.0529 |
| 15 | 13 | 24 | 15 | 2.4111 | 44.9318 | 1.049 |
| 15 | 13 | 30 | 15 | 2.293 | 45.4503 | 1.037 |
| 15 | 12 | 0 | 15 | 0 | 47.1314 | 1 |
| 15 | 12 | 5 | 15 | 1.401 | 46.8584 | 1.0058 |
| 15 | 12 | 6 | 15 | 1.597 | 46.719 | 1.0088 |
| 15 | 12 | 8 | 15 | 1.9153 | 46.3605 | 1.0166 |
| 15 | 12 | 9 | 15 | 2.0412 | 46.1421 | 1.0214 |
| 15 | 12 | 12 | 15 | 2.309 | 45.3896 | 1.0384 |
| 15 | 12 | 15 | 15 | 2.4491 | 44.726 | 1.0538 |
| 15 | 12 | 19 | 15 | 2.5062 | 44.3727 | 1.0622 |
| 15 | 12 | 24 | 15 | 2.4598 | 44.6641 | 1.0552 |
| 15 | 12 | 30 | 15 | 2.328 | 45.3137 | 1.0401 |
| 15 | 11 | 0 | 15 | 0 | 47.1314 | 1 |
| 15 | 11 | 5 | 15 | 1.4746 | 46.8112 | 1.0068 |
| 15 | 11 | 6 | 15 | 1.6767 | 46.6478 | 1.0104 |
| 15 | 11 | 8 | 15 | 2.0013 | 46.218 | 1.0198 |
| 15 | 11 | 9 | 15 | 2.128 | 45.9504 | 1.0257 |
| 15 | 11 | 12 | 15 | 2.3922 | 45.0265 | 1.0467 |
| 15 | 11 | 15 | 15 | 2.5239 | 44.2512 | 1.0651 |
| 15 | 11 | 19 | 15 | 2.5677 | 43.9225 | 1.0731 |
| 15 | 11 | 24 | 15 | 2.5064 | 44.3713 | 1.0622 |
| 15 | 11 | 30 | 15 | 2.3611 | 45.1719 | 1.0434 |
| 15 | 10 | 0 | 15 | 0 | 47.1314 | 1 |
| 15 | 10 | 5 | 15 | 1.549 | 46.7574 | 1.008 |
| 15 | 10 | 6 | 15 | 1.7569 | 46.5653 | 1.0122 |
| 15 | 10 | 8 | 15 | 2.087 | 46.0459 | 1.0236 |
| 15 | 10 | 9 | 15 | 2.2142 | 45.7155 | 1.031 |
| 15 | 10 | 12 | 15 | 2.4738 | 44.5801 | 1.0572 |
| 15 | 10 | 15 | 15 | 2.5964 | 43.6844 | 1.0789 |
| 15 | 10 | 19 | 15 | 2.6267 | 43.4107 | 1.0857 |
| 15 | 10 | 24 | 15 | 2.5506 | 44.0559 | 1.0698 |

TABLE 2-4-continued

| | | | | | | |
|---|---|---|---|---|---|---|
| 15 | 10 | 30 | 15 | 2.3922 | 45.0265 | 1.0467 |
| 15 | 9 | 0 | 15 | 0 | 47.1314 | 1 |
| 15 | 9 | 5 | 15 | 1.6232 | 46.6967 | 1.0093 |
| 15 | 9 | 6 | 15 | 1.8364 | 46.4704 | 1.0142 |
| 15 | 9 | 8 | 15 | 2.1713 | 45.8388 | 1.0282 |
| 15 | 9 | 9 | 15 | 2.2985 | 45.4295 | 1.0375 |
| 15 | 9 | 12 | 15 | 2.5527 | 44.0396 | 1.0702 |
| 15 | 9 | 15 | 15 | 2.6657 | 43.0205 | 1.0956 |
| 15 | 9 | 19 | 15 | 2.6824 | 42.8402 | 1.1002 |
| 15 | 9 | 24 | 15 | 2.5919 | 43.7225 | 1.078 |
| 15 | 9 | 30 | 15 | 2.4211 | 44.8799 | 1.0502 |
| 15 | 8 | 0 | 15 | 0 | 47.1314 | 1 |
| 15 | 8 | 5 | 15 | 1.6959 | 46.6292 | 1.0108 |
| 15 | 8 | 6 | 15 | 1.9141 | 46.3623 | 1.0166 |
| 15 | 8 | 8 | 15 | 2.2528 | 45.5924 | 1.0338 |
| 15 | 8 | 9 | 15 | 2.3798 | 45.0861 | 1.0454 |
| 15 | 8 | 12 | 15 | 2.6279 | 43.3994 | 1.086 |
| 15 | 8 | 15 | 15 | 2.7311 | 42.2621 | 1.1152 |
| 15 | 8 | 19 | 15 | 2.7345 | 42.2196 | 1.1163 |
| 15 | 8 | 24 | 15 | 2.6301 | 43.3777 | 1.0865 |

TABLE 2-5

| | | | | | | |
|---|---|---|---|---|---|---|
| 15 | 8 | 30 | 15 | 2.4476 | 44.735 | 1.0536 |
| 15 | 7 | 0 | 15 | 0 | 47.1314 | 1 |
| 15 | 7 | 5 | 15 | 1.7658 | 46.5555 | 1.0124 |
| 15 | 7 | 6 | 15 | 1.9883 | 46.2412 | 1.0193 |
| 15 | 7 | 8 | 15 | 2.3301 | 45.305 | 1.0403 |
| 15 | 7 | 9 | 15 | 2.4565 | 44.6834 | 1.0548 |
| 15 | 7 | 12 | 15 | 2.698 | 42.6637 | 1.1047 |
| 15 | 7 | 15 | 15 | 2.7917 | 41.4223 | 1.1378 |
| 15 | 7 | 19 | 15 | 2.7821 | 41.5642 | 1.1339 |
| 15 | 7 | 24 | 15 | 2.6648 | 43.0304 | 1.0953 |
| 15 | 7 | 30 | 15 | 2.4714 | 44.5948 | 1.0569 |
| 15 | 6 | 0 | 15 | 0 | 47.1314 | 1 |
| 15 | 6 | 5 | 15 | 1.8312 | 46.4771 | 1.0141 |
| 15 | 6 | 6 | 15 | 2.0576 | 46.1088 | 1.0222 |
| 15 | 6 | 8 | 15 | 2.4017 | 44.9799 | 1.0478 |
| 15 | 6 | 9 | 15 | 2.5273 | 44.2274 | 1.0657 |
| 15 | 6 | 12 | 15 | 2.7621 | 41.851 | 1.1262 |
| 15 | 6 | 15 | 15 | 2.8464 | 40.5276 | 1.1629 |
| 15 | 6 | 19 | 15 | 2.8249 | 40.8963 | 1.1525 |
| 15 | 6 | 24 | 15 | 2.6956 | 42.6914 | 1.104 |
| 15 | 6 | 30 | 15 | 2.4925 | 44.4631 | 1.06 |
| 15 | 5 | 0 | 15 | 0 | 47.1314 | 1 |
| 15 | 5 | 5 | 15 | 1.8906 | 46.3969 | 1.0158 |
| 15 | 5 | 6 | 15 | 2.1202 | 45.9694 | 1.0253 |
| 15 | 5 | 8 | 15 | 2.4658 | 44.6286 | 1.0561 |
| 15 | 5 | 9 | 15 | 2.5905 | 43.7351 | 1.0777 |
| 15 | 5 | 12 | 15 | 2.8188 | 40.9968 | 1.1496 |
| 15 | 5 | 15 | 15 | 2.8945 | 39.6188 | 1.1896 |
| 15 | 5 | 19 | 15 | 2.8621 | 40.2445 | 1.1711 |
| 15 | 5 | 24 | 15 | 2.7223 | 42.3731 | 1.1123 |
| 15 | 5 | 30 | 15 | 2.5106 | 44.3434 | 1.0629 |
| 15 | 4 | 0 | 15 | 0 | 47.1314 | 1 |
| 15 | 4 | 5 | 15 | 1.9421 | 46.3188 | 1.0175 |
| 15 | 4 | 6 | 15 | 2.1744 | 45.8304 | 1.0284 |
| 15 | 4 | 8 | 15 | 2.521 | 44.2717 | 1.0646 |
| 15 | 4 | 9 | 15 | 2.6447 | 43.2364 | 1.0901 |
| 15 | 4 | 12 | 15 | 2.867 | 40.1541 | 1.1738 |
| 15 | 4 | 15 | 15 | 2.9351 | 38.7493 | 1.2163 |
| 15 | 4 | 19 | 15 | 2.8933 | 39.6424 | 1.1889 |
| 15 | 4 | 24 | 15 | 2.7445 | 42.0887 | 1.1198 |
| 15 | 4 | 30 | 15 | 2.5256 | 44.2393 | 1.0654 |
| 15 | 3 | 0 | 15 | 0 | 47.1314 | 1 |
| 15 | 3 | 5 | 15 | 1.9842 | 46.2484 | 1.0191 |
| 15 | 3 | 6 | 15 | 2.2185 | 45.7025 | 1.0313 |
| 15 | 3 | 8 | 15 | 2.5657 | 43.9389 | 1.0727 |
| 15 | 3 | 9 | 15 | 2.6885 | 42.773 | 1.1019 |
| 15 | 3 | 12 | 15 | 2.9056 | 39.3896 | 1.1965 |
| 15 | 3 | 15 | 15 | 2.9675 | 37.9807 | 1.2409 |
| 15 | 3 | 19 | 15 | 2.9181 | 39.1255 | 1.2046 |
| 15 | 3 | 24 | 15 | 2.7621 | 41.851 | 1.1262 |
| 15 | 3 | 30 | 15 | 2.5374 | 44.1544 | 1.0674 |
| 15 | 2 | 0 | 15 | 0 | 47.1314 | 1 |
| 15 | 2 | 5 | 15 | 2.0155 | 46.1918 | 1.0203 |
| 15 | 2 | 6 | 15 | 2.2511 | 45.598 | 1.0336 |

TABLE 2-5-continued

| | | | | | | |
|---|---|---|---|---|---|---|
| 15 | 2 | 8 | 15 | 2.5986 | 43.6651 | 1.0794 |
| 15 | 2 | 9 | 15 | 2.7207 | 42.3933 | 1.1118 |

TABLE 2-6

| | | | | | | |
|---|---|---|---|---|---|---|
| 15 | 2 | 12 | 15 | 2.934 | 38.7752 | 1.2155 |
| 15 | 2 | 15 | 15 | 2.9911 | 37.3755 | 1.261 |
| 15 | 2 | 19 | 15 | 2.9361 | 38.7274 | 1.217 |
| 15 | 2 | 24 | 15 | 2.7747 | 41.6718 | 1.131 |
| 15 | 2 | 30 | 15 | 2.5459 | 44.0914 | 1.0689 |
| 15 | 1 | 0 | 15 | 0 | 47.1314 | 1 |
| 15 | 1 | 5 | 15 | 2.0347 | 46.1549 | 1.0212 |
| 15 | 1 | 6 | 15 | 2.2712 | 45.5292 | 1.0352 |
| 15 | 1 | 8 | 15 | 2.6188 | 43.4842 | 1.0839 |
| 15 | 1 | 9 | 15 | 2.7404 | 42.1431 | 1.1184 |
| 15 | 1 | 12 | 15 | 2.9512 | 38.3759 | 1.2282 |
| 15 | 1 | 15 | 15 | 3.0055 | 36.9876 | 1.2742 |
| 15 | 1 | 19 | 15 | 2.947 | 38.4762 | 1.2249 |
| 15 | 1 | 24 | 15 | 2.7824 | 41.5602 | 1.1341 |
| 15 | 1 | 30 | 15 | 2.551 | 44.0527 | 1.0699 |
| 15 | 0 | 0 | 15 | 0 | 47.1314 | 1 |
| 15 | 0 | 5 | 15 | 2.0412 | 46.1421 | 1.0214 |
| 15 | 0 | 6 | 15 | 2.278 | 45.5052 | 1.0357 |
| 15 | 0 | 8 | 15 | 2.6256 | 43.4208 | 1.0855 |
| 15 | 0 | 9 | 15 | 2.747 | 42.0556 | 1.1207 |
| 15 | 0 | 12 | 15 | 2.957 | 38.2373 | 1.2326 |
| 15 | 0 | 15 | 15 | 3.0103 | 36.854 | 1.2789 |
| 15 | 0 | 19 | 15 | 2.9506 | 38.3903 | 1.2277 |
| 15 | 0 | 24 | 15 | 2.785 | 41.5224 | 1.1351 |
| 15 | 0 | 30 | 15 | 2.5527 | 44.0396 | 1.0702 |

TABLE 3-1

| $\beta c/\beta d$ | | $\beta hs/\beta c$ | | PAPR | INCLINATION | CONPENSATION COEFFICIENT |
|---|---|---|---|---|---|---|
| 0 | 15 | 0 | 15 | 0 | 47.1705 | 1 |
| 1 | 15 | 0 | 15 | 0 | 47.1705 | 1 |
| 1 | 15 | 5 | 15 | 0.0128 | 47.1705 | 1 |
| 1 | 15 | 6 | 15 | 0.0153 | 47.1705 | 1 |
| 1 | 15 | 8 | 15 | 0.0204 | 47.1705 | 1 |
| 1 | 15 | 9 | 15 | 0.023 | 47.1705 | 1 |
| 1 | 15 | 12 | 15 | 0.0306 | 47.1705 | 1 |
| 1 | 15 | 15 | 15 | 0.0381 | 47.1705 | 1 |
| 1 | 15 | 19 | 15 | 0.0481 | 47.1705 | 1 |
| 1 | 15 | 24 | 15 | 0.0604 | 47.1705 | 1 |
| 1 | 15 | 30 | 15 | 0.0749 | 47.1704 | 1 |
| 2 | 15 | 0 | 15 | 0 | 47.1705 | 1 |
| 2 | 15 | 5 | 15 | 0.0502 | 47.1705 | 1 |
| 2 | 15 | 6 | 15 | 0.0601 | 47.1705 | 1 |
| 2 | 15 | 8 | 15 | 0.0798 | 47.1704 | 1 |
| 2 | 15 | 9 | 15 | 0.0895 | 47.1704 | 1 |
| 2 | 15 | 12 | 15 | 0.1184 | 47.1703 | 1 |
| 2 | 15 | 15 | 15 | 0.1466 | 47.1701 | 1 |
| 2 | 15 | 19 | 15 | 0.183 | 47.1697 | 1 |
| 2 | 15 | 24 | 15 | 0.2264 | 47.1689 | 1 |
| 2 | 15 | 30 | 15 | 0.2747 | 47.1677 | 1.0001 |
| 3 | 15 | 0 | 15 | 0 | 47.1705 | 1 |
| 3 | 15 | 5 | 15 | 0.1095 | 47.1703 | 1 |
| 3 | 15 | 6 | 15 | 0.1308 | 47.1702 | 1 |
| 3 | 15 | 8 | 15 | 0.1728 | 47.1698 | 1 |
| 3 | 15 | 9 | 15 | 0.1933 | 47.1695 | 1 |
| 3 | 15 | 12 | 15 | 0.2533 | 47.1683 | 1 |
| 3 | 15 | 15 | 15 | 0.3103 | 47.1665 | 1.0001 |
| 3 | 15 | 19 | 15 | 0.3813 | 47.163 | 1.0002 |
| 3 | 15 | 24 | 15 | 0.4612 | 47.1573 | 1.0003 |
| 3 | 15 | 30 | 15 | 0.5436 | 47.1489 | 1.0005 |
| 4 | 15 | 0 | 15 | 0 | 47.1705 | 1 |
| 4 | 15 | 5 | 15 | 0.1867 | 47.1696 | 1 |
| 4 | 15 | 6 | 15 | 0.2224 | 47.169 | 1 |
| 4 | 15 | 8 | 15 | 0.2918 | 47.1671 | 1.0001 |
| 4 | 15 | 9 | 15 | 0.3254 | 47.1659 | 1.0001 |
| 4 | 15 | 12 | 15 | 0.4214 | 47.1604 | 1.0002 |
| 4 | 15 | 15 | 15 | 0.5096 | 47.1527 | 1.0004 |
| 4 | 15 | 19 | 15 | 0.6145 | 47.1393 | 1.0007 |

TABLE 3-1-continued

| βc/βd | | βhs/βc | | PAPR | INCLINATION | CONPENSATION COEFFICIENT |
|---|---|---|---|---|---|---|
| 4 | 15 | 24 | 15 | 0.7247 | 47.1193 | 1.0011 |
| 4 | 15 | 30 | 15 | 0.8273 | 47.0943 | 1.0016 |
| 5 | 15 | 0 | 15 | 0 | 47.1705 | 1 |
| 5 | 15 | 5 | 15 | 0.2773 | 47.1676 | 1.0001 |
| 5 | 15 | 6 | 15 | 0.3292 | 47.1657 | 1.0001 |
| 5 | 15 | 8 | 15 | 0.4286 | 47.1599 | 1.0002 |
| 5 | 15 | 9 | 15 | 0.476 | 47.156 | 1.0003 |
| 5 | 15 | 12 | 15 | 0.6084 | 47.1402 | 1.0006 |
| 5 | 15 | 15 | 15 | 0.7255 | 47.1191 | 1.0011 |
| 5 | 15 | 19 | 15 | 0.8576 | 47.0857 | 1.0018 |
| 5 | 15 | 24 | 15 | 0.9857 | 47.0417 | 1.0027 |
| 5 | 15 | 30 | 15 | 1.0914 | 46.9955 | 1.0037 |
| 6 | 15 | 0 | 15 | 0 | 47.1705 | 1 |

TABLE 3-2

| | | | | | | |
|---|---|---|---|---|---|---|
| 6 | 15 | 5 | 15 | 0.3765 | 47.1633 | 1.0002 |
| 6 | 15 | 6 | 15 | 0.4452 | 47.1586 | 1.0003 |
| 6 | 15 | 8 | 15 | 0.575 | 47.1449 | 1.0005 |
| 6 | 15 | 9 | 15 | 0.6359 | 47.1359 | 1.0007 |
| 6 | 15 | 12 | 15 | 0.8019 | 47.1011 | 1.0015 |
| 6 | 15 | 15 | 15 | 0.9427 | 47.0578 | 1.0024 |
| 6 | 15 | 19 | 15 | 1.0928 | 46.9949 | 1.0037 |
| 6 | 15 | 24 | 15 | 1.2261 | 46.9223 | 1.0053 |
| 6 | 15 | 30 | 15 | 1.3212 | 46.8596 | 1.0066 |
| 7 | 15 | 0 | 15 | 0 | 47.1705 | 1 |
| 7 | 15 | 5 | 15 | 0.4801 | 47.1556 | 1.0003 |
| 7 | 15 | 6 | 15 | 0.5656 | 47.1462 | 1.0005 |
| 7 | 15 | 8 | 15 | 0.7244 | 47.1194 | 1.0011 |
| 7 | 15 | 9 | 15 | 0.7977 | 47.1022 | 1.0014 |
| 7 | 15 | 12 | 15 | 0.9925 | 47.039 | 1.0028 |
| 7 | 15 | 15 | 15 | 1.1508 | 46.9653 | 1.0044 |
| 7 | 15 | 19 | 15 | 1.3099 | 46.8676 | 1.0065 |
| 7 | 15 | 24 | 15 | 1.4381 | 46.7689 | 1.0086 |
| 7 | 15 | 30 | 15 | 1.5138 | 46.7013 | 1.01 |
| 8 | 15 | 0 | 15 | 0 | 47.1705 | 1 |
| 8 | 15 | 5 | 15 | 0.5846 | 47.1436 | 1.0006 |
| 8 | 15 | 6 | 15 | 0.6859 | 47.1271 | 1.0009 |
| 8 | 15 | 8 | 15 | 0.8715 | 47.0815 | 1.0019 |
| 8 | 15 | 9 | 15 | 0.9556 | 47.0531 | 1.0025 |
| 8 | 15 | 12 | 15 | 1.1738 | 46.9527 | 1.0046 |
| 8 | 15 | 15 | 15 | 1.3437 | 46.8434 | 1.007 |
| 8 | 15 | 19 | 15 | 1.5043 | 46.7101 | 1.0099 |
| 8 | 15 | 24 | 15 | 1.6204 | 46.593 | 1.0124 |
| 8 | 15 | 30 | 15 | 1.6724 | 46.5342 | 1.0137 |
| 9 | 15 | 0 | 15 | 0 | 47.1705 | 1 |
| 9 | 15 | 5 | 15 | 0.6872 | 47.1268 | 1.0009 |
| 9 | 15 | 6 | 15 | 0.8032 | 47.1008 | 1.0015 |
| 9 | 15 | 8 | 15 | 1.0126 | 47.0308 | 1.003 |
| 9 | 15 | 9 | 15 | 1.1059 | 46.9884 | 1.0039 |
| 9 | 15 | 12 | 15 | 1.3423 | 46.8444 | 1.007 |
| 9 | 15 | 15 | 15 | 1.5186 | 46.6967 | 1.0101 |
| 9 | 15 | 19 | 15 | 1.6752 | 46.5309 | 1.0137 |
| 9 | 15 | 24 | 15 | 1.7751 | 46.4052 | 1.0165 |
| 9 | 15 | 30 | 15 | 1.8021 | 46.3683 | 1.0173 |
| 10 | 15 | 0 | 15 | 0 | 47.1705 | 1 |
| 10 | 15 | 5 | 15 | 0.7858 | 47.1052 | 1.0014 |
| 10 | 15 | 6 | 15 | 0.9153 | 47.0673 | 1.0022 |
| 10 | 15 | 8 | 15 | 1.1454 | 46.9682 | 1.0043 |
| 10 | 15 | 9 | 15 | 1.2464 | 46.9097 | 1.0056 |
| 10 | 15 | 12 | 15 | 1.4962 | 46.7176 | 1.0097 |
| 10 | 15 | 15 | 15 | 1.6749 | 46.5312 | 1.0137 |
| 10 | 15 | 19 | 15 | 1.8237 | 46.3376 | 1.018 |
| 10 | 15 | 24 | 15 | 1.9055 | 46.2136 | 1.0207 |
| 10 | 15 | 30 | 15 | 1.9081 | 46.2093 | 1.0208 |
| 11 | 15 | 0 | 15 | 0 | 47.1705 | 1 |
| 11 | 15 | 5 | 15 | 0.8793 | 47.079 | 1.0019 |
| 11 | 15 | 6 | 15 | 1.0207 | 47.0274 | 1.003 |
| 11 | 15 | 8 | 15 | 1.2687 | 46.8954 | 1.0059 |
| 11 | 15 | 9 | 15 | 1.3758 | 46.8192 | 1.0075 |
| 11 | 15 | 12 | 15 | 1.6352 | 46.5767 | 1.0127 |
| 11 | 15 | 15 | 15 | 1.8133 | 46.3525 | 1.0176 |

TABLE 3-3

| | | | | | | |
|---|---|---|---|---|---|---|
| 11 | 15 | 19 | 15 | 1.9521 | 46.1364 | 1.0224 |
| 11 | 15 | 24 | 15 | 2.0152 | 46.0236 | 1.0249 |
| 11 | 15 | 30 | 15 | 1.9952 | 46.0605 | 1.0241 |
| 12 | 15 | 0 | 15 | 0 | 47.1705 | 1 |
| 12 | 15 | 5 | 15 | 0.9668 | 47.0489 | 1.0026 |
| 12 | 15 | 6 | 15 | 1.1188 | 46.982 | 1.004 |
| 12 | 15 | 8 | 15 | 1.382 | 46.8144 | 1.0076 |
| 12 | 15 | 9 | 15 | 1.4941 | 46.7196 | 1.0097 |
| 12 | 15 | 12 | 15 | 1.7598 | 46.4256 | 1.016 |
| 12 | 15 | 15 | 15 | 1.9352 | 46.165 | 1.0218 |
| 12 | 15 | 19 | 15 | 2.0628 | 45.9318 | 1.027 |
| 12 | 15 | 24 | 15 | 2.1077 | 45.8388 | 1.0291 |
| 12 | 15 | 30 | 15 | 2.067 | 45.9233 | 1.0272 |
| 13 | 15 | 0 | 15 | 0 | 47.1705 | 1 |
| 13 | 15 | 5 | 15 | 1.0481 | 47.0156 | 1.0033 |
| 13 | 15 | 6 | 15 | 1.2094 | 46.9323 | 1.0051 |
| 13 | 15 | 8 | 15 | 1.4853 | 46.7275 | 1.0095 |
| 13 | 15 | 9 | 15 | 1.6013 | 46.6136 | 1.0119 |
| 13 | 15 | 12 | 15 | 1.8709 | 46.2677 | 1.0195 |
| 13 | 15 | 15 | 15 | 2.0422 | 45.9723 | 1.0261 |
| 13 | 15 | 19 | 15 | 2.1581 | 45.727 | 1.0316 |
| 13 | 15 | 24 | 15 | 2.1859 | 45.6617 | 1.033 |
| 13 | 15 | 30 | 15 | 2.1266 | 45.7979 | 1.03 |
| 14 | 15 | 0 | 15 | 0 | 47.1705 | 1 |
| 14 | 15 | 5 | 15 | 1.1231 | 46.9798 | 1.0041 |
| 14 | 15 | 6 | 15 | 1.2925 | 46.8795 | 1.0062 |
| 14 | 15 | 8 | 15 | 1.5792 | 46.6368 | 1.0114 |
| 14 | 15 | 9 | 15 | 1.6981 | 46.5035 | 1.0143 |
| 14 | 15 | 12 | 15 | 1.9698 | 46.1058 | 1.0231 |
| 14 | 15 | 15 | 15 | 2.1361 | 45.777 | 1.0304 |
| 14 | 15 | 19 | 15 | 2.2405 | 45.5248 | 1.0361 |
| 14 | 15 | 24 | 15 | 2.2523 | 45.4935 | 1.0369 |
| 14 | 15 | 30 | 15 | 2.1765 | 45.6842 | 1.0325 |
| 15 | 15 | 0 | 15 | 0 | 47.1705 | 1 |
| 15 | 15 | 5 | 15 | 1.1919 | 46.9425 | 1.0049 |
| 15 | 15 | 6 | 15 | 1.3684 | 46.8249 | 1.0074 |
| 15 | 15 | 8 | 15 | 1.6641 | 46.5439 | 1.0135 |
| 15 | 15 | 9 | 15 | 1.7854 | 46.3913 | 1.0168 |
| 15 | 15 | 12 | 15 | 2.0576 | 45.942 | 1.0267 |
| 15 | 15 | 15 | 15 | 2.2185 | 45.5814 | 1.0349 |
| 15 | 15 | 19 | 15 | 2.3117 | 45.3269 | 1.0407 |
| 15 | 15 | 24 | 15 | 2.309 | 45.335 | 1.0405 |
| 15 | 15 | 30 | 15 | 2.2185 | 45.5814 | 1.0349 |
| 15 | 14 | 0 | 15 | 0 | 47.1705 | 1 |
| 15 | 14 | 5 | 15 | 1.2591 | 46.9016 | 1.0057 |
| 15 | 14 | 6 | 15 | 1.4422 | 46.7654 | 1.0087 |
| 15 | 14 | 8 | 15 | 1.746 | 46.4436 | 1.0157 |
| 15 | 14 | 9 | 15 | 1.8691 | 46.2704 | 1.0195 |
| 15 | 14 | 12 | 15 | 2.1409 | 45.7661 | 1.0307 |
| 15 | 14 | 15 | 15 | 2.2958 | 45.3732 | 1.0396 |
| 15 | 14 | 19 | 15 | 2.3777 | 45.1214 | 1.0454 |
| 15 | 14 | 24 | 15 | 2.3608 | 45.1765 | 1.0441 |
| 15 | 14 | 30 | 15 | 2.2565 | 45.4824 | 1.0371 |
| 15 | 13 | 0 | 15 | 0 | 47.1705 | 1 |
| 15 | 13 | 5 | 15 | 1.329 | 46.8541 | 1.0068 |
| 15 | 13 | 6 | 15 | 1.5186 | 46.6967 | 1.0101 |

TABLE 3-4

| | | | | | | |
|---|---|---|---|---|---|---|
| 15 | 13 | 8 | 15 | 1.8299 | 46.3287 | 1.0182 |
| 15 | 13 | 9 | 15 | 1.9546 | 46.1321 | 1.0225 |
| 15 | 13 | 12 | 15 | 2.2249 | 45.565 | 1.0352 |
| 15 | 13 | 15 | 15 | 2.3729 | 45.1373 | 1.045 |
| 15 | 13 | 19 | 15 | 2.4427 | 44.8945 | 1.0507 |
| 15 | 13 | 24 | 15 | 2.4111 | 45.0079 | 1.048 |
| 15 | 13 | 30 | 15 | 2.293 | 45.3811 | 1.0394 |
| 15 | 12 | 0 | 15 | 0 | 47.1705 | 1 |
| 15 | 12 | 5 | 15 | 1.401 | 46.7994 | 1.0079 |
| 15 | 12 | 6 | 15 | 1.597 | 46.6181 | 1.0118 |
| 15 | 12 | 8 | 15 | 1.9153 | 46.1978 | 1.0211 |
| 15 | 12 | 9 | 15 | 2.0412 | 45.9742 | 1.026 |
| 15 | 12 | 12 | 15 | 2.309 | 45.335 | 1.0405 |
| 15 | 12 | 15 | 15 | 2.4491 | 44.8705 | 1.0513 |
| 15 | 12 | 19 | 15 | 2.5062 | 44.6452 | 1.0566 |
| 15 | 12 | 24 | 15 | 2.4598 | 44.8301 | 1.0522 |
| 15 | 12 | 30 | 15 | 2.328 | 45.2784 | 1.0418 |
| 15 | 11 | 0 | 15 | 0 | 47.1705 | 1 |

TABLE 3-4-continued

| | | | | | | |
|---|---|---|---|---|---|---|
| 15 | 11 | 5 | 15 | 1.4746 | 46.7371 | 1.0093 |
| 15 | 11 | 6 | 15 | 1.6767 | 46.5291 | 1.0138 |
| 15 | 11 | 8 | 15 | 2.0013 | 46.0493 | 1.0243 |
| 15 | 11 | 9 | 15 | 2.128 | 45.7948 | 1.03 |
| 15 | 11 | 12 | 15 | 2.3922 | 45.073 | 1.0465 |
| 15 | 11 | 15 | 15 | 2.5239 | 44.5703 | 1.0583 |
| 15 | 11 | 19 | 15 | 2.5677 | 44.3735 | 1.063 |
| 15 | 11 | 24 | 15 | 2.5064 | 44.6443 | 1.0566 |
| 15 | 11 | 30 | 15 | 2.3611 | 45.1753 | 1.0442 |
| 15 | 10 | 0 | 15 | 0 | 47.1705 | 1 |
| 15 | 10 | 5 | 15 | 1.549 | 46.6672 | 1.0108 |
| 15 | 10 | 6 | 15 | 1.7569 | 46.4294 | 1.016 |
| 15 | 10 | 8 | 15 | 2.087 | 45.8824 | 1.0281 |
| 15 | 10 | 9 | 15 | 2.2142 | 45.5921 | 1.0346 |
| 15 | 10 | 12 | 15 | 2.4738 | 44.776 | 1.0535 |
| 15 | 10 | 15 | 15 | 2.5964 | 44.2354 | 1.0664 |
| 15 | 10 | 19 | 15 | 2.6267 | 44.0806 | 1.0701 |
| 15 | 10 | 24 | 15 | 2.5506 | 44.4525 | 1.0611 |
| 15 | 10 | 30 | 15 | 2.3922 | 45.073 | 1.0465 |
| 15 | 9 | 0 | 15 | 0 | 47.1705 | 1 |
| 15 | 9 | 5 | 15 | 1.6232 | 46.59 | 1.0125 |
| 15 | 9 | 6 | 15 | 1.8364 | 46.3192 | 1.0184 |
| 15 | 9 | 8 | 15 | 2.1713 | 45.6965 | 1.0323 |
| 15 | 9 | 9 | 15 | 2.2985 | 45.3653 | 1.0398 |
| 15 | 9 | 12 | 15 | 2.5527 | 44.4427 | 1.0614 |
| 15 | 9 | 15 | 15 | 2.6657 | 43.8663 | 1.0753 |
| 15 | 9 | 19 | 15 | 2.6824 | 43.7695 | 1.0777 |
| 15 | 9 | 24 | 15 | 2.5919 | 44.2573 | 1.0658 |
| 15 | 9 | 30 | 15 | 2.4211 | 44.9728 | 1.0489 |
| 15 | 8 | 0 | 15 | 0 | 47.1705 | 1 |
| 15 | 8 | 5 | 15 | 1.6959 | 46.5062 | 1.0143 |
| 15 | 8 | 6 | 15 | 1.9141 | 46.1997 | 1.021 |
| 15 | 8 | 8 | 15 | 2.2528 | 45.4922 | 1.0369 |
| 15 | 8 | 9 | 15 | 2.3798 | 45.1146 | 1.0456 |
| 15 | 8 | 12 | 15 | 2.6279 | 44.0743 | 1.0702 |
| 15 | 8 | 15 | 15 | 2.7311 | 43.4668 | 1.0852 |
| 15 | 8 | 19 | 15 | 2.7345 | 43.445 | 1.0858 |
| 15 | 8 | 24 | 15 | 2.6301 | 44.0623 | 1.0705 |

TABLE 3-5

| | | | | | | |
|---|---|---|---|---|---|---|
| 15 | 8 | 30 | 15 | 2.4476 | 44.8764 | 1.0511 |
| 15 | 7 | 0 | 15 | 0 | 47.1705 | 1 |
| 15 | 7 | 5 | 15 | 1.7658 | 46.4177 | 1.0162 |
| 15 | 7 | 6 | 15 | 1.9883 | 46.0728 | 1.0238 |
| 15 | 7 | 8 | 15 | 2.3301 | 45.272 | 1.0419 |
| 15 | 7 | 9 | 15 | 2.4565 | 44.8427 | 1.0519 |
| 15 | 7 | 12 | 15 | 2.698 | 43.6759 | 1.08 |
| 15 | 7 | 15 | 15 | 2.7917 | 43.0445 | 1.0959 |
| 15 | 7 | 19 | 15 | 2.7821 | 43.1147 | 1.0941 |
| 15 | 7 | 24 | 15 | 2.6648 | 43.8717 | 1.0752 |
| 15 | 7 | 30 | 15 | 2.4714 | 44.7854 | 1.0533 |
| 15 | 6 | 0 | 15 | 0 | 47.1705 | 1 |
| 15 | 6 | 5 | 15 | 1.8312 | 46.3269 | 1.0182 |
| 15 | 6 | 6 | 15 | 2.0576 | 45.942 | 1.0267 |
| 15 | 6 | 8 | 15 | 2.4017 | 45.0408 | 1.0473 |
| 15 | 6 | 9 | 15 | 2.5273 | 44.5558 | 1.0587 |
| 15 | 6 | 12 | 15 | 2.7621 | 43.2578 | 1.0904 |
| 15 | 6 | 15 | 15 | 2.8464 | 42.6119 | 1.107 |
| 15 | 6 | 19 | 15 | 2.8249 | 42.7883 | 1.1024 |
| 15 | 6 | 24 | 15 | 2.6956 | 43.6905 | 1.0797 |
| 15 | 6 | 30 | 15 | 2.4925 | 44.7017 | 1.0552 |
| 15 | 5 | 0 | 15 | 0 | 47.1705 | 1 |
| 15 | 5 | 5 | 15 | 1.8906 | 46.2373 | 1.0202 |
| 15 | 5 | 6 | 15 | 2.1202 | 45.8119 | 1.0297 |
| 15 | 5 | 8 | 15 | 2.4658 | 44.8072 | 1.0527 |
| 15 | 5 | 9 | 15 | 2.5905 | 44.2645 | 1.0657 |
| 15 | 5 | 12 | 15 | 2.8188 | 42.8368 | 1.1012 |
| 15 | 5 | 15 | 15 | 2.8945 | 42.1863 | 1.1181 |
| 15 | 5 | 19 | 15 | 2.8621 | 42.478 | 1.1105 |
| 15 | 5 | 24 | 15 | 2.7223 | 43.5241 | 1.0838 |
| 15 | 5 | 30 | 15 | 2.5106 | 44.627 | 1.057 |
| 15 | 4 | 0 | 15 | 0 | 47.1705 | 1 |
| 15 | 4 | 5 | 15 | 1.9421 | 46.1533 | 1.022 |
| 15 | 4 | 6 | 15 | 2.1744 | 45.6892 | 1.0324 |
| 15 | 4 | 8 | 15 | 2.521 | 44.5829 | 1.058 |
| 15 | 4 | 9 | 15 | 2.6447 | 43.9841 | 1.0724 |

TABLE 3-5-continued

| | | | | | | |
|---|---|---|---|---|---|---|
| 15 | 4 | 12 | 15 | 2.867 | 42.4354 | 1.1116 |
| 15 | 4 | 15 | 15 | 2.9351 | 41.7895 | 1.1288 |
| 15 | 4 | 19 | 15 | 2.8933 | 42.1972 | 1.1179 |
| 15 | 4 | 24 | 15 | 2.7445 | 43.3781 | 1.0874 |
| 15 | 4 | 30 | 15 | 2.5256 | 44.5631 | 1.0585 |
| 15 | 3 | 0 | 15 | 0 | 47.1705 | 1 |
| 15 | 3 | 5 | 15 | 1.9842 | 46.0802 | 1.0237 |
| 15 | 3 | 6 | 15 | 2.2185 | 45.5814 | 1.0349 |
| 15 | 3 | 8 | 15 | 2.5657 | 44.3831 | 1.0628 |
| 15 | 3 | 9 | 15 | 2.6885 | 43.7337 | 1.0786 |
| 15 | 3 | 12 | 15 | 2.9056 | 42.0808 | 1.1209 |
| 15 | 3 | 15 | 15 | 2.9675 | 41.4457 | 1.1381 |
| 15 | 3 | 19 | 15 | 2.9181 | 41.9601 | 1.1242 |
| 15 | 3 | 24 | 15 | 2.7621 | 43.2578 | 1.0904 |
| 15 | 3 | 30 | 15 | 2.5374 | 44.5115 | 1.0597 |
| 15 | 2 | 0 | 15 | 0 | 47.1705 | 1 |
| 15 | 2 | 5 | 15 | 2.0155 | 46.0231 | 1.0249 |
| 15 | 2 | 6 | 15 | 2.2511 | 45.4966 | 1.0368 |
| 15 | 2 | 8 | 15 | 2.5986 | 44.2244 | 1.0666 |
| 15 | 2 | 9 | 15 | 2.7207 | 43.5346 | 1.0835 |

TABLE 3-6

| | | | | | | |
|---|---|---|---|---|---|---|
| 15 | 2 | 12 | 15 | 2.934 | 41.8012 | 1.1284 |
| 15 | 2 | 15 | 15 | 2.9911 | 41.1789 | 1.1455 |
| 15 | 2 | 19 | 15 | 2.9361 | 41.7797 | 1.129 |
| 15 | 2 | 24 | 15 | 2.7747 | 43.1681 | 1.0927 |
| 15 | 2 | 30 | 15 | 2.5459 | 44.4737 | 1.0606 |
| 15 | 1 | 0 | 15 | 0 | 47.1705 | 1 |
| 15 | 1 | 5 | 15 | 2.0347 | 45.9867 | 1.0257 |
| 15 | 1 | 6 | 15 | 2.2712 | 45.4422 | 1.038 |
| 15 | 1 | 8 | 15 | 2.6183 | 44.1218 | 1.0691 |
| 15 | 1 | 9 | 15 | 2.7404 | 43.4058 | 1.0867 |
| 15 | 1 | 12 | 15 | 2.9512 | 41.6218 | 1.1333 |
| 15 | 1 | 15 | 15 | 3.0055 | 41.0095 | 1.1502 |
| 15 | 1 | 19 | 15 | 2.947 | 41.6667 | 1.1321 |
| 15 | 1 | 24 | 15 | 2.7824 | 43.1127 | 1.0941 |
| 15 | 1 | 30 | 15 | 2.551 | 44.4505 | 1.0612 |

TABLE 4

| $\beta c/\beta d$ | $\beta hs/\beta c$ | PAPR | INCLINATION | CONPENSATION COEFFICIENT |
|---|---|---|---|---|
| 15 | 0 | 0 | 15 | 0 | 47.2539 | 0.9982 |
| 15 | 0 | 5 | 15 | 2.0412 | 46.2616 | 1.0196 |
| 15 | 0 | 6 | 15 | 2.278 | 45.4783 | 1.0372 |
| 15 | 0 | 8 | 15 | 2.6256 | 42.6087 | 1.1071 |
| 15 | 0 | 9 | 15 | 2.747 | 40.6299 | 1.161 |
| 15 | 0 | 12 | 15 | 2.957 | 34.9464 | 1.3498 |
| 15 | 0 | 15 | 15 | 3.0103 | 32.8582 | 1.4356 |
| 15 | 0 | 19 | 15 | 2.9506 | 35.1767 | 1.341 |
| 15 | 0 | 24 | 15 | 2.785 | 39.8465 | 1.1838 |
| 15 | 0 | 30 | 15 | 2.5527 | 43.4872 | 1.0847 |

What is claimed is:

1. A polar modulation transmission apparatus that inputs a phase modulated signal generated from a phase component of an input complex signal to a signal input port of a power amplifier and that inputs a power supply voltage, which is adjusted by an amplitude modulated signal generated from an amplitude component from the input complex signal, to a power supply input port of the power amplifier, the polar modulation transmission apparatus comprising:
    a detector that detects an output power of the power amplifier;
    a peak to average power ratio calculating section that calculates a peak to average power ratio of the input complex signal;
    a compensation value generating section that outputs a compensation value corresponding to the calculated peak to average power ratio;

an arithmetic operation section that performs an arithmetic operation using the compensation value and a detection result obtained by the detector; and a transmission power control section that, by scaling the phase modulated signal and the power supply voltage based on an arithmetic operation result obtained by the arithmetic operation section, controls the output power of the power amplifier.

2. The polar modulation transmission apparatus according to claim 1, wherein the arithmetic operation section comprises a multiplying section that multiplies the compensation value by the detection result obtained by the detector.

3. The polar modulation transmission apparatus according to claim 2, wherein, as the compensation value, the compensation value generating section stores a value for compensating for detection sensitivity of the detector in association with the peak to average power ratio.

4. The polar modulation transmission apparatus according to claim 1, wherein the arithmetic operation section comprises an adding section that adds the compensation value to the detection result obtained by the detector.

5. The polar modulation transmission apparatus according to claim 4, wherein, as the compensation value, the compensation value generating section stores in association with the peak to average power ratio a value for making smaller a difference between a value detected by the detector in compressed mode and a value detected by the detector in uncompressed mode.

6. The polar modulation transmission apparatus according to claim 1, wherein the input complex signal comprises a spread modulated signal.

7. A polar modulation transmission apparatus that inputs a phase modulated signal generated from a phase component of an input complex signal to a signal input port of a power amplifier and that inputs a power supply voltage, which is adjusted by an amplitude modulated signal generated from an amplitude component from the input complex signal, to a power supply input port of the power amplifier, the polar modulation transmission apparatus comprising:
- a detector that detects an output power of the power amplifier;
- a peak to average power ratio calculating section that calculates a peak to average power ratio of the input complex signal;
- a compensation value generating section that outputs a compensation value corresponding to the calculated peak to average power ratio;
- an arithmetic operation section that performs an arithmetic operation using the compensation value and a detection result obtained by the detector; and
- a transmission power control section that, by scaling the phase modulated signal and the power supply voltage based on an arithmetic operation result obtained by the arithmetic operation section, controls the output power of the power amplifier, wherein:
  the transmission power control section comprises:
    - a power table that stores a power setting value; and
    - a power setting module that compensates for a read address of when a power setting value is read from the power table; and
  the arithmetic operation section performs an arithmetic operation using the compensation value outputted from the compensation value generating section and the read address.

8. The polar modulation transmission apparatus according to claim 7, wherein the arithmetic operation section comprises a multiplying section that multiplies the compensation value by the detection result obtained by the detector.

9. The polar modulation transmission apparatus according to claim 8, wherein, as the compensation value, the compensation value generating section stores a value for compensating for detection sensitivity of the detector, in association with the peak to average power ratio.

10. The polar modulation transmission apparatus according to claim 7, wherein the arithmetic operation section comprises an adding section that adds the compensation value to the detection result obtained by the detector.

11. The polar modulation transmission apparatus according to claim 10, wherein, as the compensation value, the compensation value generating section stores in association with the peak to average power ratio a value for making smaller a difference between a value detected by the detector in compressed mode and a value detected by the detector in uncompressed mode.

12. A polar modulation transmission apparatus that inputs a phase modulated signal generated from a phase component of an input complex signal to a signal input port of a power amplifier and that inputs a power supply voltage, which is adjusted by an amplitude modulated signal generated from an amplitude component from the input complex signal, to a power supply input port of the power amplifier, the polar modulation transmission apparatus comprising:
- a detector that detects an output power of the power amplifier;
- a peak to average power ratio calculating section that calculates a peak to average power ratio of the input complex signal;
- a compensation value generating section that outputs a first compensation value and a second compensation value corresponding to the calculated peak to average power ratio;
- a multiplying section that multiplies the first compensation value by a detection result obtained by the detector; and
- an adding section that adds the second compensation value to the detection result obtained by the detector.

13. The polar modulation transmission apparatus according to claim 12, wherein, as the first compensation value, the compensation value generating section stores a compensation value for compensating for detection sensitivity of the detector in association with the peak to average power ratio.

14. The polar modulation transmission apparatus according to claim 12, wherein, as the second compensation value, the compensation value generating section stores in association with the peak to average power ratio a compensation value for making smaller a difference between a value detected by the detector in compressed mode and a value detected by the detector in uncompressed mode.

15. A polar modulation transmission apparatus that inputs a phase modulated signal generated from a phase component of an input complex signal to a signal input port of a power amplifier and that inputs a power supply voltage, which is adjusted by an amplitude modulated signal generated from an amplitude component from the input complex signal, to a power supply input port of the power amplifier, the polar modulation transmission apparatus comprising:
- a detector that detects an output power of the power amplifier;
- a peak to average power ratio calculating section that calculates a peak to average power ratio of the input complex signal;
- a first compensation value generating section that stores a compensation value for compensating for detection sensitivity of the detector in association with the peak to average power ratio and that outputs a first compensation value corresponding to the calculated peak to average power ratio;

a second compensation value generating section that stores a compensation value for making smaller a difference between a value detected by the detector in compressed mode and a value detected by the detector in uncompressed mode, in association with the peak to average power ratio and that outputs a second compensation value corresponding to the calculated peak to average power ratio;

a multiplying section that multiplies the first compensation value by a detection result obtained by the detector; and an adding section that adds the second compensation value to the detection result obtained by the detector.

16. The polar modulation transmission apparatus according to claim 15, wherein the input complex signal comprises a spread modulated signal.

* * * * *